(12) United States Patent
Kirsch et al.

(10) Patent No.: US 11,001,147 B2
(45) Date of Patent: May 11, 2021

(54) OPERATING UNIT FOR A DEVICE, IN PARTICULAR FOR A VEHICLE COMPONENT

(71) Applicant: BEHR-HELLA THERMOCONTROL GMBH, Stuttgart (DE)

(72) Inventors: Stefan Kirsch, Soest (DE); Harri Pankratz, Bad Sassendorf (DE); Dirk Nagel, Paderborn (DE)

(73) Assignee: BEHR-HELLA THERMOCONTROL GMBH, Stuttgart (DE)

( * ) Notice: Subject to any disclaimer, the term of this patent is extended or adjusted under 35 U.S.C. 154(b) by 141 days.

(21) Appl. No.: 16/481,703

(22) PCT Filed: Jan. 30, 2018

(86) PCT No.: PCT/EP2018/052273
§ 371 (c)(1),
(2) Date: Jul. 29, 2019

(87) PCT Pub. No.: WO2018/141745
PCT Pub. Date: Aug. 9, 2018

(65) Prior Publication Data
US 2019/0391652 A1 Dec. 26, 2019

(30) Foreign Application Priority Data

Feb. 1, 2017 (DE) .................... 10 2017 201 624.8
May 16, 2017 (DE) .................... 10 2017 208 238.0

(51) Int. Cl.
*G06F 3/041* (2006.01)
*B60K 37/06* (2006.01)
(Continued)

(52) U.S. Cl.
CPC ............ *B60K 37/06* (2013.01); *G06F 3/016* (2013.01); *H03K 17/96* (2013.01);
(Continued)

(58) Field of Classification Search
CPC ...... B60K 2370/143; B60K 2370/1438; B60K 2370/158; B60K 37/06; G06F 3/016; H03K 17/96; H03K 2217/96062
See application file for complete search history.

(56) References Cited

U.S. PATENT DOCUMENTS

2003/0174121 A1 9/2003 Poupyrev et al.
2004/0075676 A1 4/2004 Rosenberg et al.
(Continued)

FOREIGN PATENT DOCUMENTS

DE    11 2011 101 553 T5    3/2013
DE    10 2016 114 697 A1    2/2018
(Continued)

OTHER PUBLICATIONS

International Search Report of International Application No. PCT/EP2018/052273 dated May 24, 2018, with English translation.
Written Opinion of International Application No. PCT/EP2018/052273 dated May 24, 2018.

*Primary Examiner* — Insa Sadio
(74) *Attorney, Agent, or Firm* — Morgan, Lewis & Bockius LLP

(57) ABSTRACT

The operating unit comprises an actuator, which mechanically excites an operating element. The actuator comprises a support strip made of a resilient material. Piezo elements, which are connected to the support strip in a shear-resistant manner, are located on both outer surfaces of the support strip. As a result of the alternate arrangement of the piezo elements, the support strip assumes an undulating form when moving out of its inactivated state. One side of the support strip is mechanically connected to the operating element and the other side is mechanically connected to a counterbalance. The support strip itself is mechanically fixed in the housing. In its inactivated state, the operating element and the counterbalance are at a different distance from one another than in the undulating activated state, (Continued)

wherein they move in opposite directions and thus lead to a compensation of dynamic forces acting on the housing.

20 Claims, 18 Drawing Sheets

(51) Int. Cl.
*G06F 3/01* (2006.01)
*H03K 17/96* (2006.01)

(52) U.S. Cl.
CPC .............................. *B60K 2370/143* (2019.05); *B60K 2370/1438* (2019.05); *B60K 2370/158* (2019.05); *H03K 2217/96062* (2013.01)

(56) References Cited

U.S. PATENT DOCUMENTS

| 2011/0027678 | A1  | 2/2011  | Nuessle |
| 2011/0276878 | A1* | 11/2011 | Sormunen ........... G06F 3/03547 715/702 |
| 2013/0127767 | A1* | 5/2013  | Sorvisto ................ G06F 3/0416 345/173 |
| 2019/0163280 | A1  | 5/2019  | Schwab et al. |

FOREIGN PATENT DOCUMENTS

| DE | 10 2017 208 238 B4 | 12/2018 |
| EP | 2 479 654 A1 | 7/2012 |

* cited by examiner

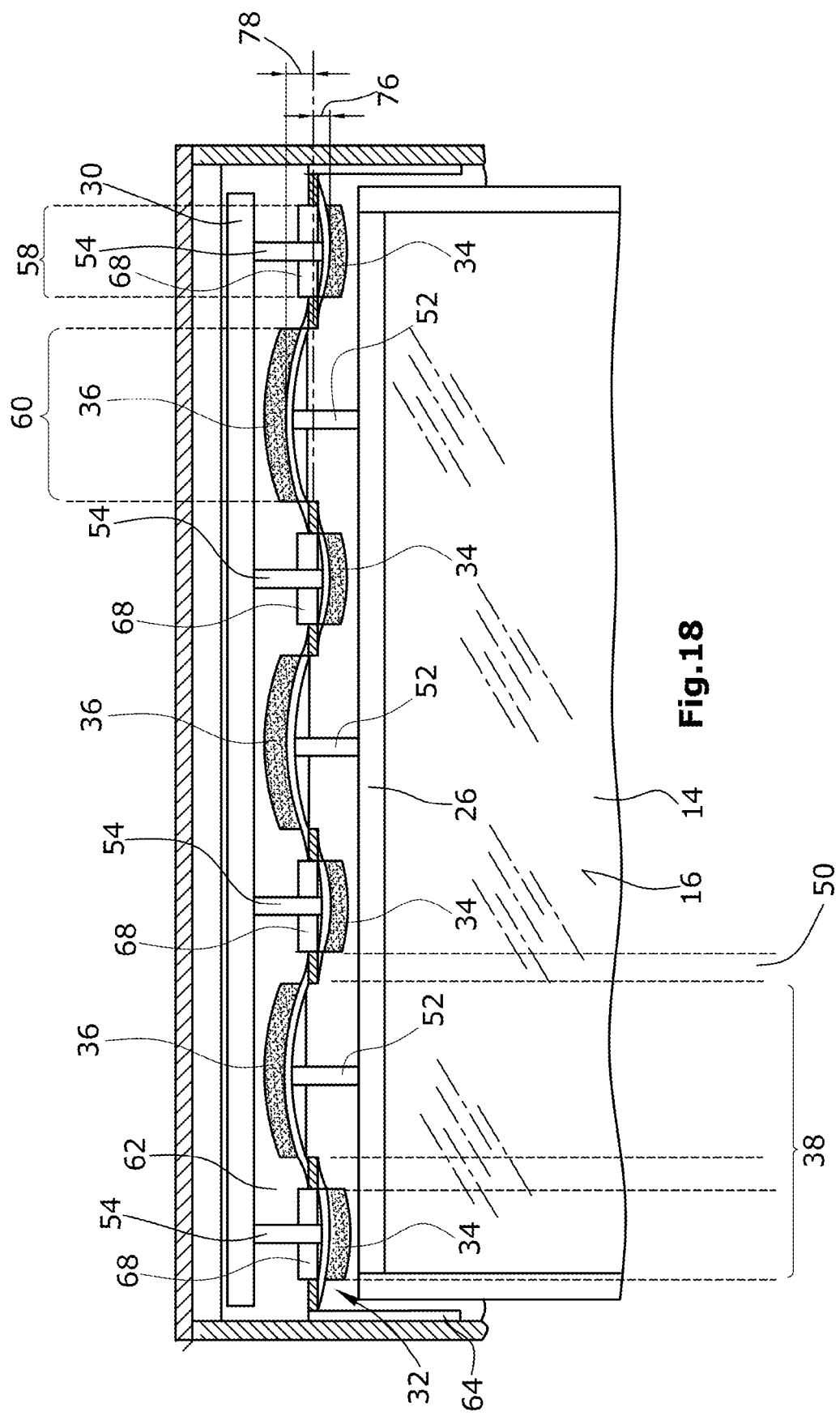

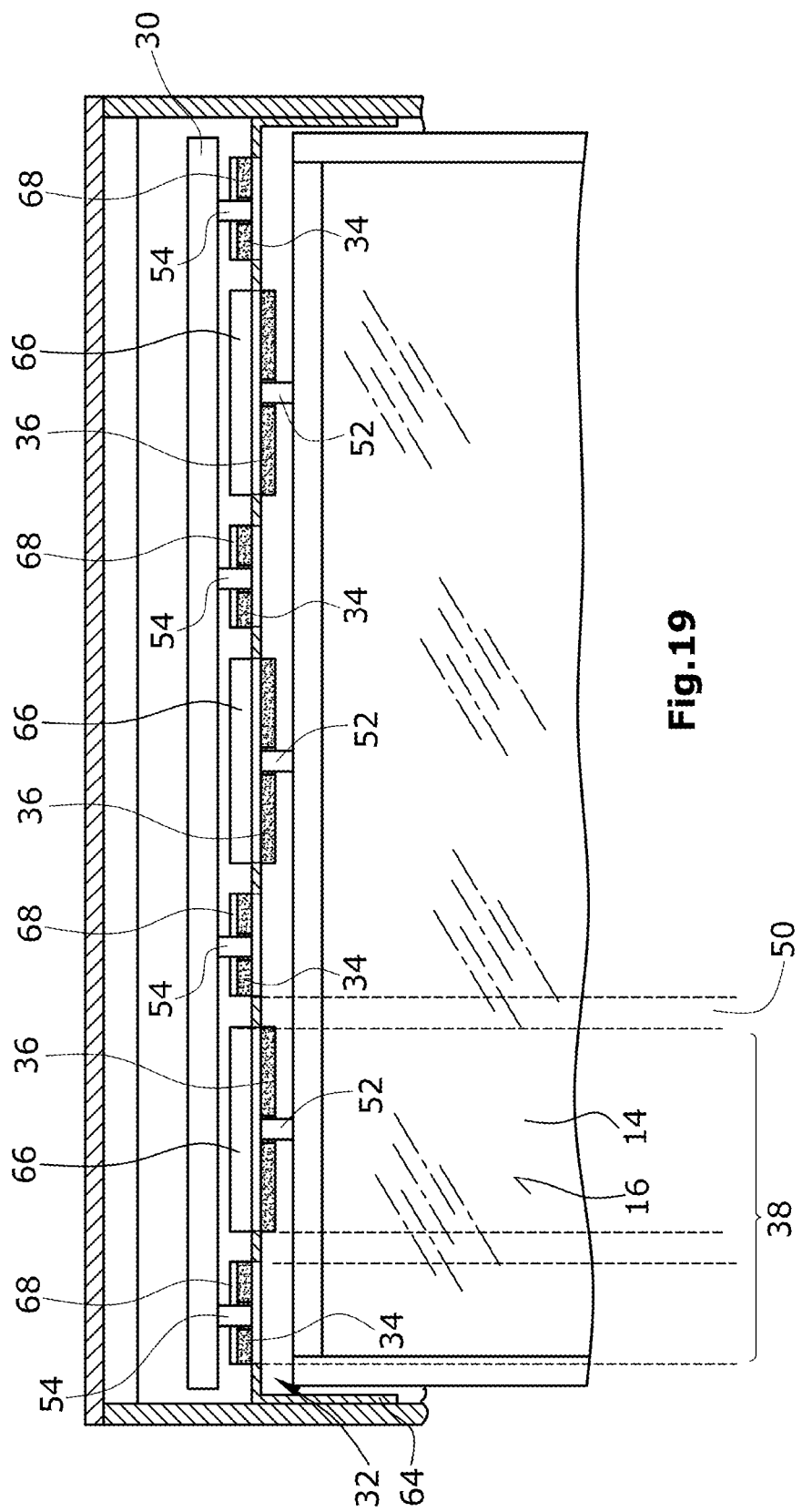

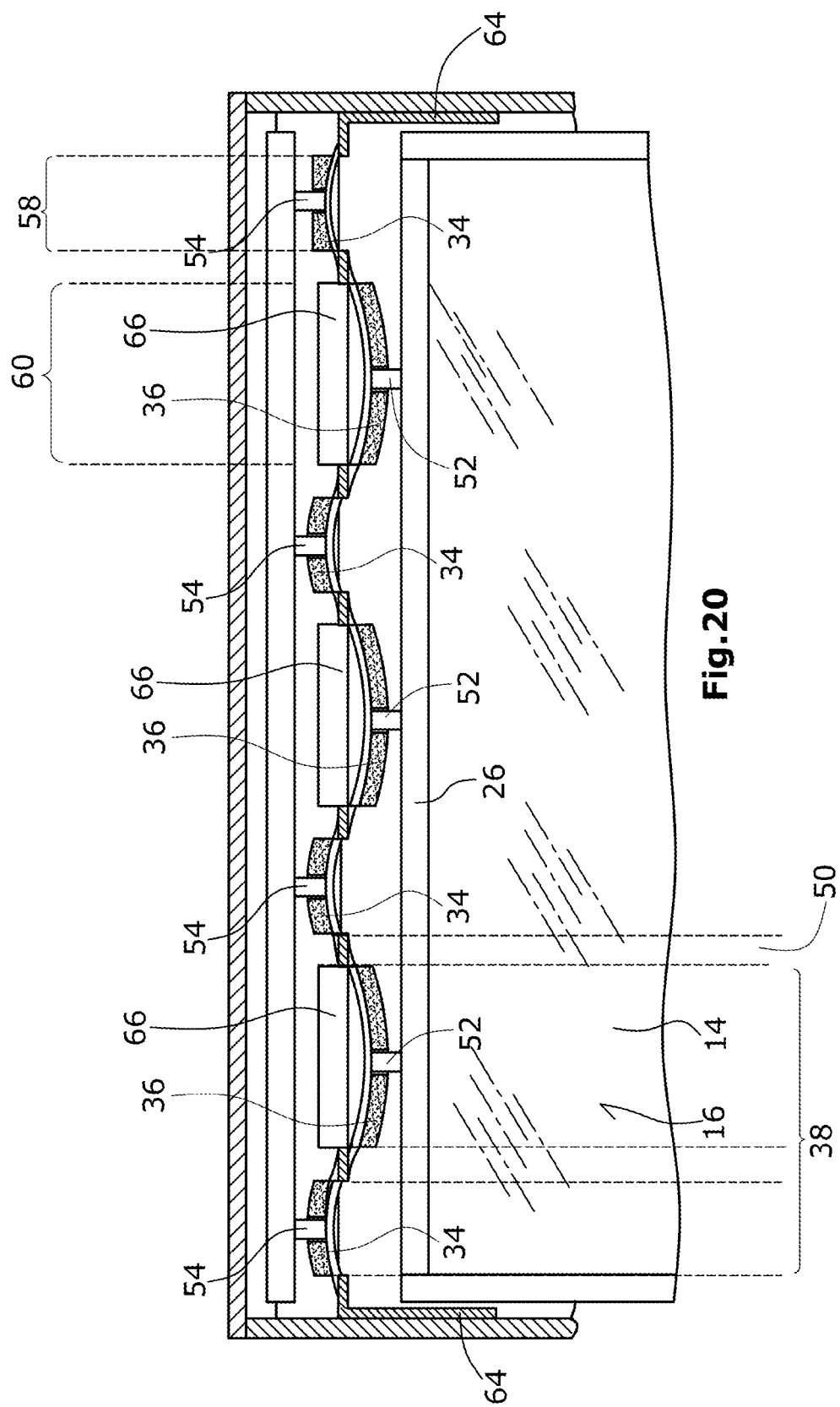

OPERATING UNIT FOR A DEVICE, IN PARTICULAR FOR A VEHICLE COMPONENT

CROSS REFERENCE

This application is the U.S. National Phase under 35 U.S.C. § 371 of International Application No. PCT/EP2018/052273 filed on Jan. 30, 2018, which claims the benefit of German Application Nos. 10 2017 201 624.8 filed on Feb. 1, 2017 and 10 2017 208 238.0 filed on May 16, 2017, the entire contents of each are hereby incorporated by reference.

The invention relates to an operating unit for a device, for example for a vehicle component. In its most general form the invention relates to a human-machine interface (MMI or HMI) with active haptic feedback with compensation of outwardly acting forces, so that vibrations of the operating unit occurring as a result of the active haptic feedback do not have a detrimental effect (for example in respect of acoustics and mechanics) on the environment of the operating unit.

Display modules in motor vehicles are often equipped with active haptic feedback. The triggering of the feedback on an operating field provided with a not insignificant mass should not generate an inadmissible dynamic transfer of force to the vehicle, since this can lead to parasitic noises and/or vibrations in the vehicle depending on the installation situation.

Furthermore, the haptic feedback should be largely independent of the elasticity of the connection of the operating unit to its surrounding environment (for example dashboard, centre console).

Figure 1:
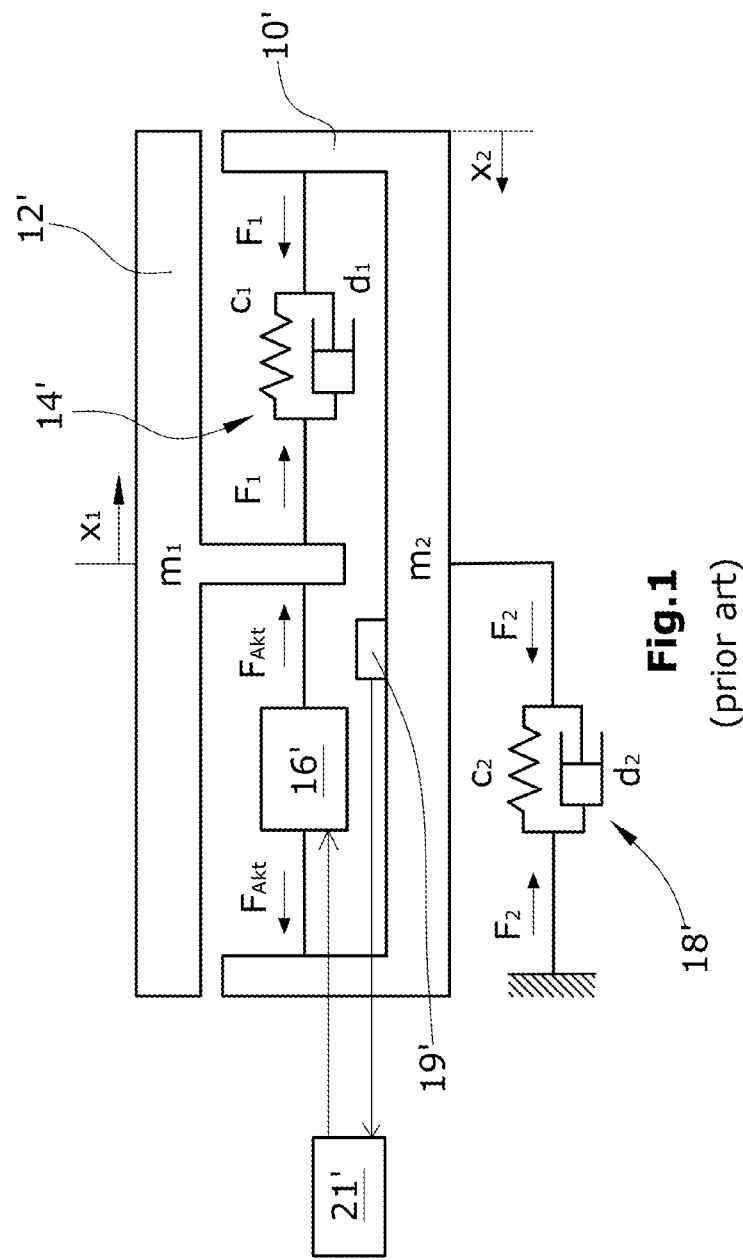

A device equipped with active haptic feedback consists substantially of an operating element with operating field, touchpad or touchscreen, which is fastened elastically to the device housing by means of a spring system, an actuator for deflecting the operating field, and a housing, which for example is fixedly installed in a vehicle. The forces acting in a device design of this kind are shown in FIG. 1.

In order to generate the haptic feedback, the display is moved over a certain path $x_1(t)$ from its inactivated position. The display acceleration $a_1(t)$ can assume values of more than 30 m/s², which, with a moved display mass $m_1$ of more than 0.5 kg and a generally small housing mass $m_2$, leads to a not insignificant dynamic force $F_2(t)$ on the device fastening in the vehicle.

In the case of a rigid device mount or fastening (rigid spring system $c_2$, $d_2$), this force, which changes quickly over time, can cause inadmissible noises and/or vibrations in the vehicle.

By contrast, in the case of a soft fastening (soft spring system $c_2$, $d_2$), it has proven difficult to adhere to installation tolerances of the device in the vehicle. Furthermore, the reconciliation of the necessary actuator force progression $F_{Act}(t)$ is not possible in some circumstances due to the presence of a further degree of freedom, specifically the housing movement $x_2(t)$ and thus also additional inherent frequencies in the system.

It is known that the forces acting on the housing, which act on the housing on account of the mechanical excitation of the operating element, can be compensated by counterbalances excitable inversely to the operating element. Installation space is needed inside the housing for the corresponding hardware (actuator and counterbalance and also spring systems).

The object of the invention is to create a concept for an operating unit with active haptic feedback, which concept is improved with regard to the creation of parasitic noises and/or vibrations, wherein the spatial requirement for the actuator and the counterbalance and also the springs should be as low as possible.

In order to achieve this object, an operating unit for a device is proposed by the invention, in particular for a vehicle component, generally speaking a human-machine interface (MMI or HMI), wherein the operating unit is provided with a housing, which has an operating element with an operating field, such as a touchscreen or a touchpad or a display or a cover plate of a touchscreen or a display and is intended to be fastened in and/or to a device, in particular to a vehicle dashboard or vehicle centre console, wherein the operating element is mounted elastically in the housing, a sensor for identifying operation of the operating element, an actuator for mechanically exciting the operating element in the event that operation of the operating element has been identified, and a counterbalance, which is mounted movably in/on the housing, wherein the counterbalance is mechanically excitable by the, or an actuator in the event that operation of the operating element has been identified, wherein the counterbalance is movable for substantial compensation and/or prevention and/or damping of forces that act on the housing as a result of the movement of the operating element occurring when the actuator is activated, wherein the actuator is provided with a support strip comprising a resilient material, in particular spring steel, and having a first outer surface and a second outer surface, wherein the support strip has at least one dividing group formed of a first attachment portion, a second attachment portion and a first intermediate portion arranged between the two attachment portions, wherein the first attachment portion, the first intermediate portion and the second attachment portion are arranged in succession in the longitudinal extent of the support strip, wherein, with a plurality of adjacent dividing groups in its longitudinal extent, the support strip has a second intermediate portion between the second attachment portion of one dividing group and the first attachment portion of the adjacent dividing group, first and second electrically controllable piezo elements connected in a shear-resistant manner to the support strip, each of which piezo elements—considered in the longitudinal extent of the support strip—has a length that without electrical actuation of the piezo element assumes a first length value and with electrical actuation assumes a second length value, which is different from the first length value, wherein at least one first piezo element is arranged in a first attachment portion of the support strip on the first outer surface thereof and at least one second piezo element is arranged in a second attachment portion of the support strip on the second outer surface thereof, wherein the first intermediate portions and, if provided, the second intermediate portions of the support strip are mechanically coupled to the housing for the purpose of fixing the support strip, and wherein the support strip is mechanically coupled to the operating element in a first attachment portion (for example at its second outer surface) and is mechanically coupled to the counterbalance in a second attachment portion (for example at its first outer surface), and a control unit, by means of which the piezo elements can be actuated in order to transfer the support strip from its inactivated state, in which the operating element and the counterbalance, which are arranged on either side of the support strip, have a first distance from one another, with displacement of operating element and counterbalance in opposite directions, into an undulating activated state and in order to transfer the support strip from the activated stated back into the inactivated state.

The operating unit according to the invention comprises a housing with an operating element, which is provided with an operating field. The operating element is for example a touchscreen or a touchpad or a display or a cover plate of a touchscreen or a touchpad or a display or a cover plate of a touchscreen or a display (the upper sides of these operating elements form operating fields). The housing can be fastened in and/or to the device. For example, the housing of the control unit is integrated in a vehicle dashboard or in a vehicle centre console. The operating element is mounted elastically in the housing. A manual actuation of the operating element, that is to say a manual action on the operating field of the operating element, is identified by means of an actuation sensor (for example touch panel). Here, the operating element is preferably moved to a hardly noticeable extent, wherein the path covered or the force acting on the operating element is identified by means of the sensor (so-called force sense).

The mechanical excitation for the active haptic feedback (force feedback) is achieved with the aid of an actuator. A counterbalance is preferably moved oppositely (phase-shifted by 180°) as compared to the movement of the operating element in the event that a counterbalance is mechanically excited, which counterbalance is in turn mounted movably in/on the housing. The counterbalance is likewise mounted elastically in the housing.

In accordance with the invention an actuator provided with piezo elements (referred to hereinafter as a piezo actuator for the sake of simplicity) as described above is used as actuator for mechanically exciting the operating element. The piezo actuator according to the invention comprises a support strip formed from a resilient material which has two outer surfaces (first and second outer surfaces) pointing away from one another. Electrically actuatable piezoceramic elements (referred to hereinafter as piezo elements for the sake of simplicity), which for example are formed in one or more layers, are disposed on both outer surfaces. The piezo elements may thus have either one or more layers formed from piezo ceramic. The piezo elements are connected to the support strip in a shear-proof or shear-resistant manner and experience a change in length, i.e. their extent as considered in the longitudinal axis of the support strip, in the event of electrical actuation. Due to the alternating arrangement of the piezo elements, the support strip, which preferably comprises spring steel, assumes an undulating form when moving out of its inactivated state. The inactivated states can be characterised for example by a linear course, or also by a curved, but not undulating course. In its free regions, not occupied by the piezo elements, of its two outer surfaces, the support strip is mechanically connected on one side to the operating element and is mechanically connected on its other side to the counterbalance. The support strip itself is mechanically fixed in the housing, wherein it can deform reversibly within its regions provided with piezo elements, in each case in a half-wave form, in spite of mechanical fixing in the housing.

The support strip has at least one dividing group of portions, which comprise a first attachment portion, a second attachment portion, and a first intermediate portion arranged between the two attachment portions. A plurality of dividing groups of this kind can be provided. In each dividing group the first attachment portion is adjoined by the first intermediate portion, and this is adjoined by the second attachment portion (considered in the longitudinal extent of the support strip). If a plurality of dividing groups of this kind are provided, a second intermediate portion is disposed between adjacent dividing groups. The support strip can be fixed, for example in the housing, in the region of the first and, if provided, the second intermediate portions.

The piezo elements are now arranged alternately on the two outer surfaces of the support strip. A first piezo element is thus disposed in a first attachment portion of the support strip on the first outer surface thereof, whereas a second piezo element is arranged in a second attachment portion of the support strip on the second outer surface thereof. At the free outer surfaces of each attachment portion of the support strip, the support strip is mechanically coupled on both sides to the operating element and the counterbalance. For example, the first attachment portions of the support strip are thus mechanically coupled on the second outer surface thereof to the operating element, and the second attachment portions are mechanically coupled on the first outer surface of the support strip to the counterbalance.

Alternatively, the support strip can be connected within the attachment portions to the operating element or the counterbalance also on those outer surfaces on which the piezo elements are disposed. In this case, the connection points on the support strip between said support strip and operating element or counterbalance are thus exposed, which for example can be achieved in that, per attachment portion, for example two distanced piezo elements are connected in a shear-resistant manner to the support strip, wherein the mechanical coupling of the support strip to operating element or counter balance is provided between said piezo elements.

By the actuation of the piezo elements and the shear-resistant coupling thereof to the support strip, the support strip is provided with an undulating form, which causes the distance between the operating element and counterbalance in the inactivated state of the support strip to change when the support strip assumes the undulating form. The operating element and support strip move relative to one another in opposite directions, more specifically either towards one another or away from one another, when the support strip is transferred from its inactivated state into its undulating activated state. Precisely this movement in opposite directions of operating element and counterbalance is now used in accordance with the invention in order to avoid outwardly acting moments of the operating unit (pulse avoidance). The ratio of the operating element stroke movement to the counterbalance stroke movement is inverse here to the ratio of the weight of the operating element to the weight of the counterbalance. The different stroke movements can be realised for example in that the length of the first attachment portions (typically each having the same length) of the support strip is different from the length of the second attachment portions (likewise typically having the same length). Alternatively or also additionally, however, piezo elements expanding out and collapsing in to varying extents can also be installed in the first and second attachment portions.

The actuator according to the invention has the advantage of a flat design that has a comparatively small format. The partial masses of the support strip that are represented by the attachment portions coupled mechanically to the counterbalance can be considered to be a contribution to the counterbalance and in this regard form a counterbalance inherent to the actuator. Since the support strip consists of resilient material, the elastic attachment of operating element and counterbalance is already an integral part of the actuator. The piezo elements also support the recovery capability of the support strip. The actuator according to the invention can be accommodated advantageously in the narrow gap between operating element and for example operating element housing frame. This installation space generally has small dimensions and can be utilised optimally with the aid of the "strip actuator" according to the invention.

It is also possible to use one actuator according to the invention on each of two edge portions of the operating element running parallel to one another. However, it must be ensured here that the second actuator does not have a counterbalance and is arranged synchronously with the first actuator in such a way that one of the actuators for the haptic feedback repels the operating element, whereas the other actuator at the same time attracts the operating element. One of the two actuators then still acts on the counterbalance, which either is provided on the actuator repelling the operating field and is likewise repelled, or is provided on the actuator attracting the operating element and is likewise attracted by the actuator. In both cases the counterbalance then moves in a direction opposite that of the movement of the operating element initiated by the two actuators.

With appropriate design measures (for example mechanical connection directly or indirectly, optionally via gearing mechanisms), it is possible for the deflections of the support strip on the one hand towards the operating element and on the other hand towards the counterbalance to be transferred, which is used as a whole for pulse avoidance. Here, in those deflection portions coupled to the counterbalance, the mass of the support strip can be interpreted itself already as (part of the) counterbalance which is required for pulse avoidance. Due to the construction, the support strip capable of recovery functions as a return spring, such that additional springs can be spared or at least can be dimensioned so as to be weaker. The piezo elements themselves also function as springs, since they automatically deform back into their inactivated states once the actuation is complete. The thicker are the piezo elements, the stronger is the recovery effect.

Depending on how many individual, in particular multilayer, piezo ceramics are arranged as piezo elements on the support strip, there is a different force-path ratio of the support strip. Generally, the following relationship applies: the more individual piezo elements (which are shorter) that are used, the greater is the force at the expense of the deflection stroke. Longer (and fewer) piezo elements signify a greater deflection stroke, but less force.

The mechanical fixing of the support strip of the actuator according to the invention in or on the housing is achieved in an advantageous development of the invention expediently by first mounting flanges, which protrude from the two lateral edges of the support strip and run at an angle, in particular at right angles, to the support strip. In an embodiment of this kind of the actuator, recesses are provided in the support strip on the lateral edges thereof and/or on the mounting flanges thereof and extend along the first and second attachment portions. The support strip is connected to the mounting flanges by bridges in the region of the first intermediate portions and, if provided, also in the region of the second intermediate portions. Due to the angled mounting flanges, the support strip is provided with stability in the region of its intermediate portions, whereas it can bend on account of the recesses between the mounting flanges when the piezo elements are actuated. The support strip twists in the intermediate portions in order to assume its undulating activated state. In this regard, it should be noted that the undulating form of the support strip in the activated state is such that the support strip deforms elastically and thus reversibly.

For further stability and fixing of the support strip of the actuator according to the invention in the housing, second mounting flanges can be provided, which are arranged at the opposite ends (considered in the longitudinal extent) of the support strip and likewise run at an angle, in particular at right angles, to the side of the support strip. Both second mounting flanges can be angled relative to a common side of the support strip or relative to opposite sides of the support strip.

In a further expedient embodiment of the invention it can be provided that connection elements protrude from the support strip on one side, preferably the side that is arranged opposite the counterbalance, which connection elements are used to fix the support strip in/on the housing. These connection elements are formed for example in the manner of gusset plates, that is to say in a planar manner, and extend preferably over the entire width of the support strip. The balancing weight, which for example is formed as a material strip body, in this case expediently has recesses, through which the connection elements extend with play. The counterbalance, however, can also consist of partial masses, which are arranged as individual (in particular solid) bodies between adjacent connection elements. Thus, the support strip is fixed by the connection elements, for example in the region of the housing in which said housing runs parallel to the edge portion of the operating element, wherein the counterbalance is arranged between support strip and housing. The operating element is then situated on the side of the support strip facing away from the counterbalance.

Further advantageous embodiments of the invention are described in the dependent claims.

One variant of the invention provides an actuator which can be installed in an operating unit for a device according to the above description and is provided with
- a first support strip comprising a resilient material, in particular spring steel, and having a first outer surface and a second outer surface,
    wherein the first support strip has at least one dividing group with two first attachment portions and a second attachment portion arranged in each case therebetween, wherein the attachment portions are arranged in succession in the longitudinal extent of the first support strip,
- a second support strip, running parallel to the first support strip, comprising a resilient material, in particular spring steel, and having a first outer surface facing the first outer surface of the first support strip and a second outer surface facing away from the first outer surface of the first support strip,
    wherein the second support strip comprises at least one dividing group with two first attachment portions and a second attachment portion arranged therebetween, wherein the attachment portions are arranged in succession in the longitudinal extent of the second support strip, a connection element, by means of which the two support strips are connected to one another and which is connected to the housing in order to fix the two support strips, wherein the connection element connects first attachment portions of the first support strip on the first outer surface thereof to first attachment portions of the second support strip on the first outer surface thereof, first and second electrically actuatable piezo elements connected in a shear-resistant manner to the two support strips, each of which piezo elements—considered in the longitudinal extent of the support strip—has a length that without electrical actuation of the piezo element assumes a first length value and with electrical actuation assumes a second length value different from the first length value, wherein at least one first piezo element is arranged in each first attachment portion of the first support strip on the second outer surface thereof and at least one second piezo element is arranged in each second attachment portion of the first support strip on the first outer surface thereof, and wherein at least one first piezo element is arranged in each first attachment portion of the second support strip on the second outer surface thereof, and at least one second piezo element is arranged in each second attachment portion of the second support strip on the first outer surface thereof, and wherein the first support strip (for example on its second outer surface) is coupled mechanically in each second attachment portion to the operating element, and the second support strip (for example on its second outer surface) is coupled mechanically in each second attachment portion to the counterbalance, wherein a control unit is provided, by means of which the piezo elements can be actuated in order to transfer both support strips from their inactivated states, in which the operating element and the counterbalance, which are arranged on either side of the arrangement formed of the two support strips and the connection element, have a first distance from one another, with displacement of operating element and counterbalance in opposite directions, into an undulating activated state, in which the operating element and counterbalance have a second distance from one another, different from the first distance, and in order to transfer the support strips from their activated states back into their inactivated states.

Whereas the actuator according to the first variant of the invention described further above has a single support strip, the actuator according to the above-described second variant of the invention is provided with two support strips, which are connected to one another with the aid of a connection element. Each support strip, as described above in conjunction with the individual strip actuator, is provided on both sides and alternately with first and second piezo elements. The two support strips are arranged parallel to one another and can be arranged for example symmetrically to the longitudinal axis of the connection element running between both support strips. Both support strips can be transferred from the inactivated state into an undulating activated state by actuation of the piezo elements. The arrangement formed of the two support strips and the connection element is situated between operating element and counterbalance, such that, when the piezo elements are actuated, the distance between operating element and counterbalance changes (more specifically becomes larger or smaller). This is accompanied consequently by a displacement movement in opposite directions of operating element and counterbalance. A piezo double-strip actuator of this kind can also be installed in duplicate, wherein here it is also true that one of the two actuators does not have a counterbalance. In this regard, reference is made to the above description of the duplicate arrangement of a piezo single-strip actuator on parallel opposite edges of the operating element.

It can be provided advantageously that each support strip has at least one further dividing group, which comprises a first attachment portion and a second attachment portion, which is arranged next to a first attachment portion of an adjacent dividing group, that the connection element connects the two support strips at their first outer surfaces in the respective first attachment portion of each further dividing group, that the operating element is mechanically coupled to the first support strip at the second outer surface thereof in the second attachment portion of each further dividing group and the counterbalance is mechanically coupled to the second support strip on the second outer surface thereof in the first attachment portion of each further dividing group, and that a first piezo element is connected in a shear-resistant manner to the relevant support strip at the second outer surface of each support strip in the first attachment portion of each further dividing group, and a second piezo element is connected in a shear-resistant manner to the relevant support strip on the first outer surface of each support strip in the second attachment portion of each further dividing group.

It is also true for the second variant of the actuator according to the invention that the mechanical connection of one support strip to the operating element and of the other support strip to the counterbalance and also the mechanical connection of both support strips to the connection element can be realised in the individual attachment portions on those outer surfaces of the two support strips that either do not have any piezo elements or are occupied by piezo elements. With regard to these different possible embodiments of the mechanical coupling of the actuator, reference is also made to the details provided in conjunction with the piezo single-strip actuator.

The undulating form of the support strip is realised in accordance with the invention by means of the piezo elements, which are arranged alternately and in succession on both outer surfaces of the support strip in a shear-resistant manner, for example glued. The support strip is provided with an undulating form by way of a linear elongation of the piezo elements as they are actuated. In so doing, both the piezo elements and the support strips deform elastically, and therefore the the undulating form is provided only to a minor extent, however this is sufficient since the operating element is excited only in the region of $\frac{1}{10}$ mm for the haptic feedback.

The piezo elements can also be arranged all on one of the two outer surfaces of the support strip. However, each second piezo element then ought to experience an increase in its length, and the other piezo elements a reduction in their length, in order to provide the support strip with its undulating form in the activated state.

In accordance with a further variant of the invention the actuator is designed as a piezo actuator, and the actuator has an electrically excitable piezo ceramic element and also a mechanical gearing mechanism for converting a linear elongation (with subsequent reduction in length) of the piezo ceramic element into a movement of the operating field, wherein the mechanical gearing mechanism has at least one gearing mechanism element forming the balancing weight and/or part of the balancing weight and/or the elastic mounting of the operating field and at least one further gearing mechanism element forming the elastic mounting of the operating field.

Figure 2:
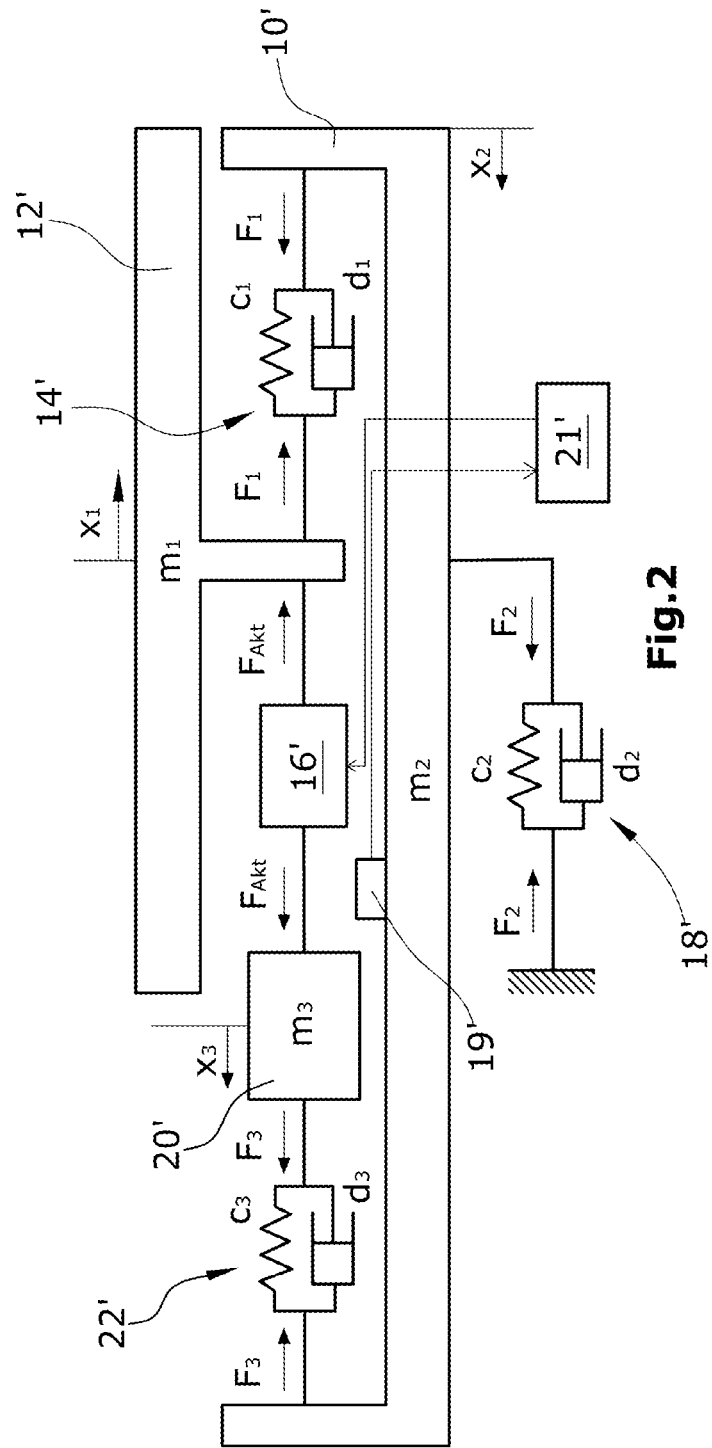
Figure 3:
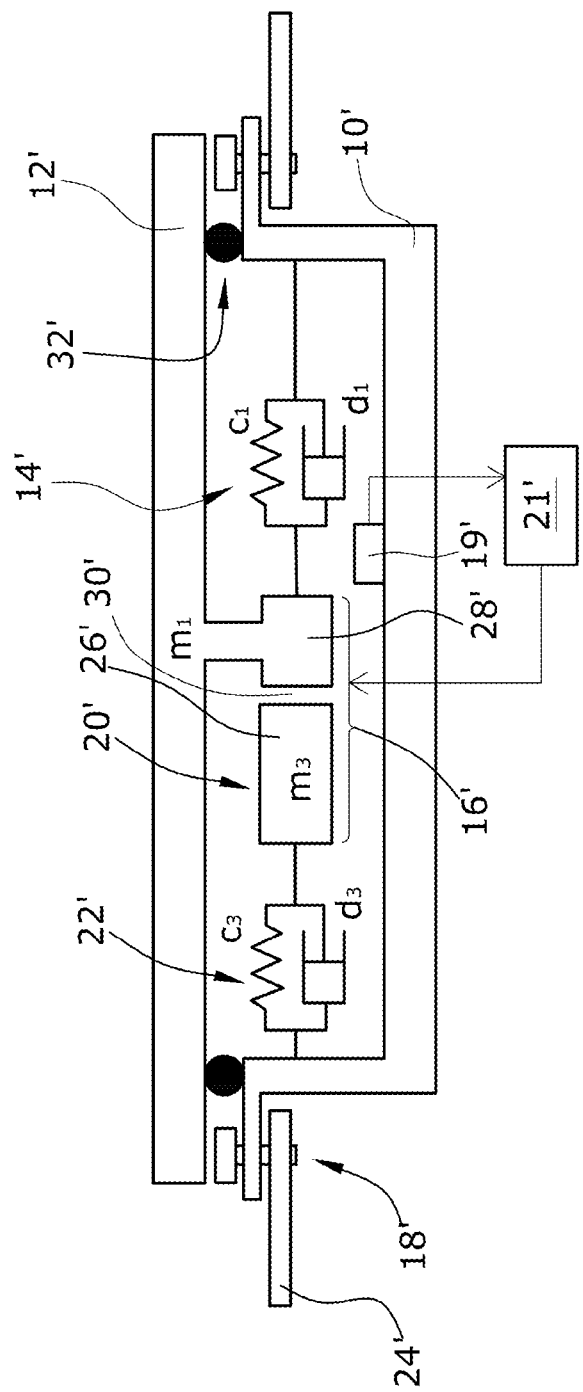
Figure 4:
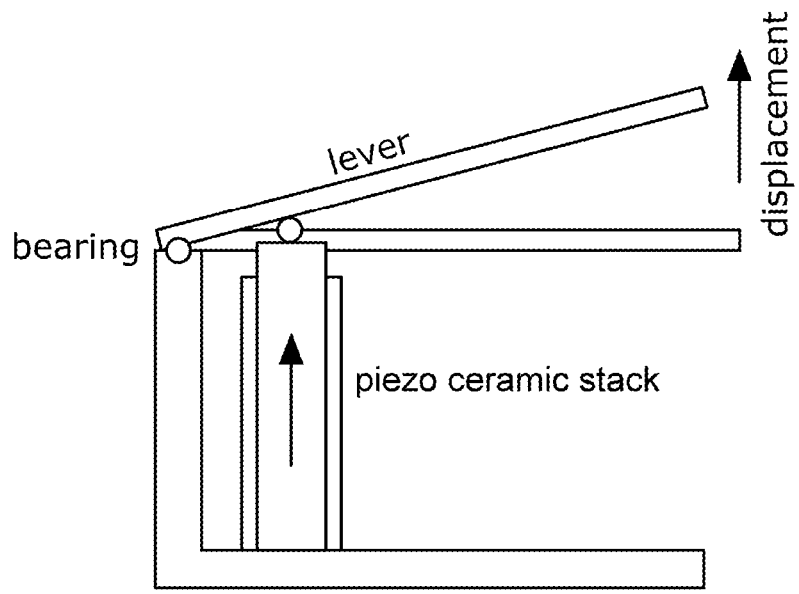
Figure 5:
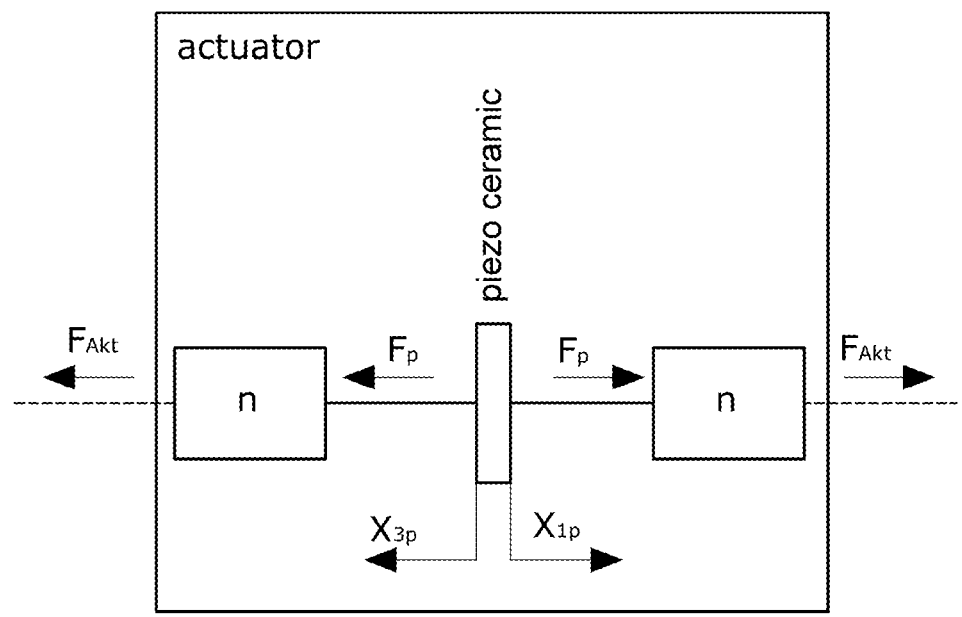
Figure 6:
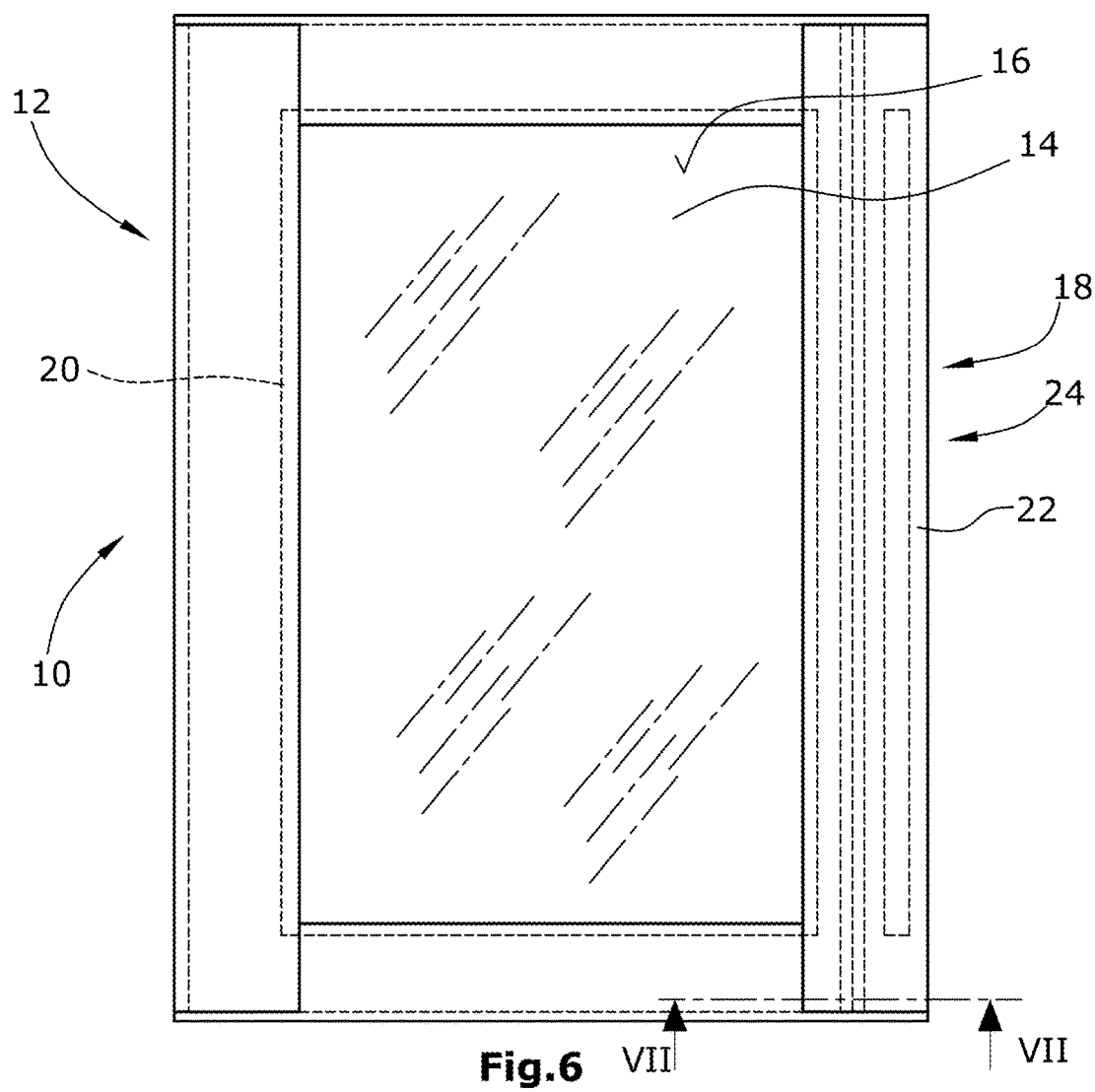
Figure 7:
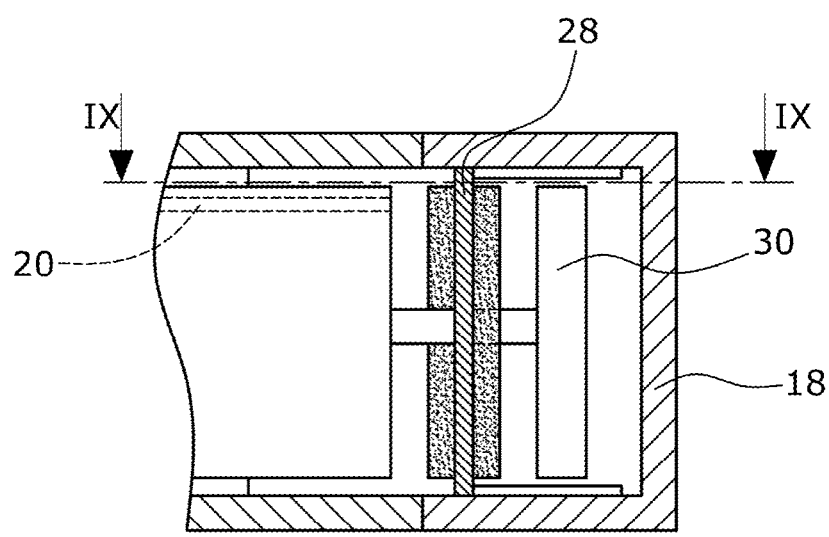
Figure 8:
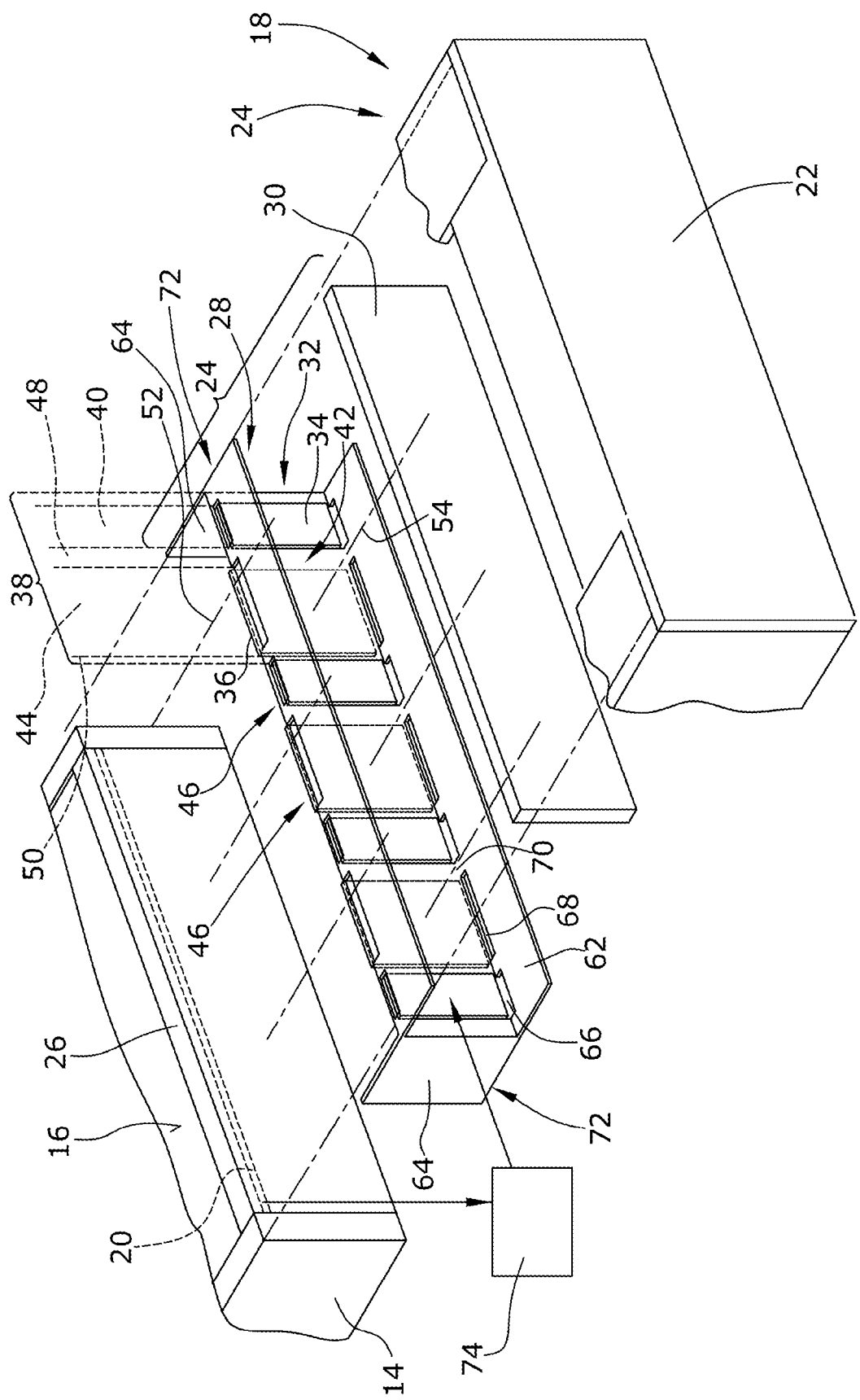
Figure 9:
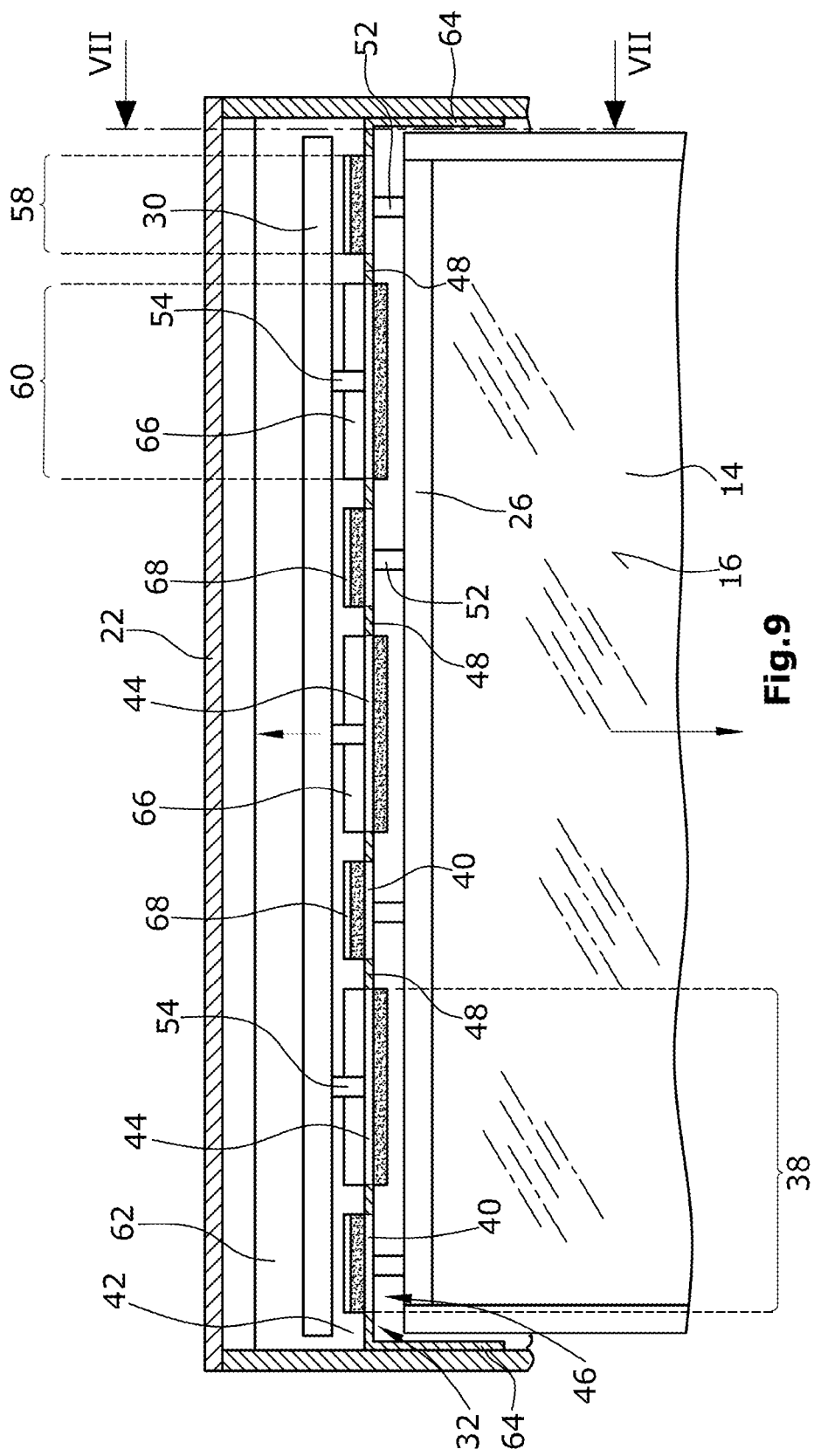
Figure 10:
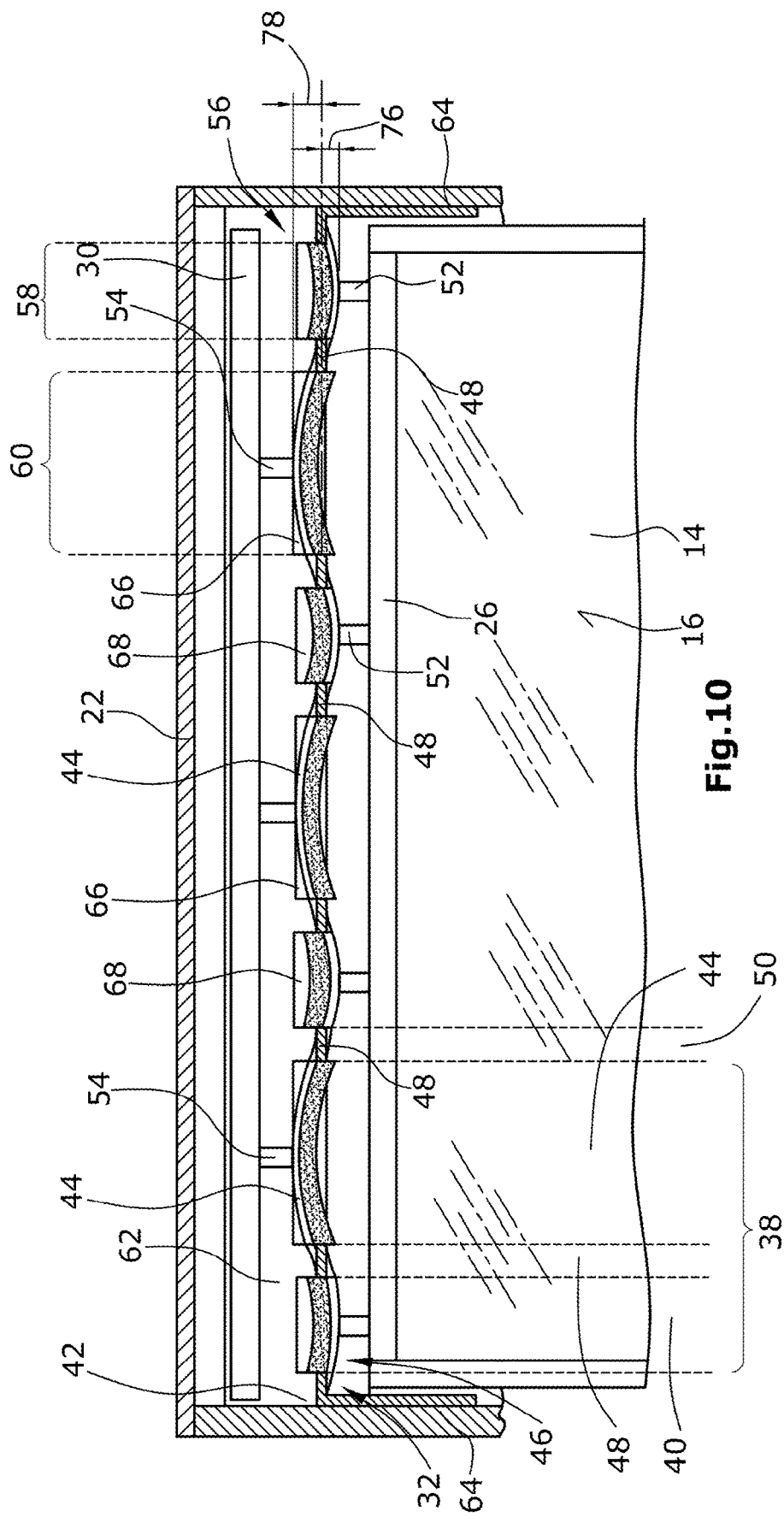
Figure 11:
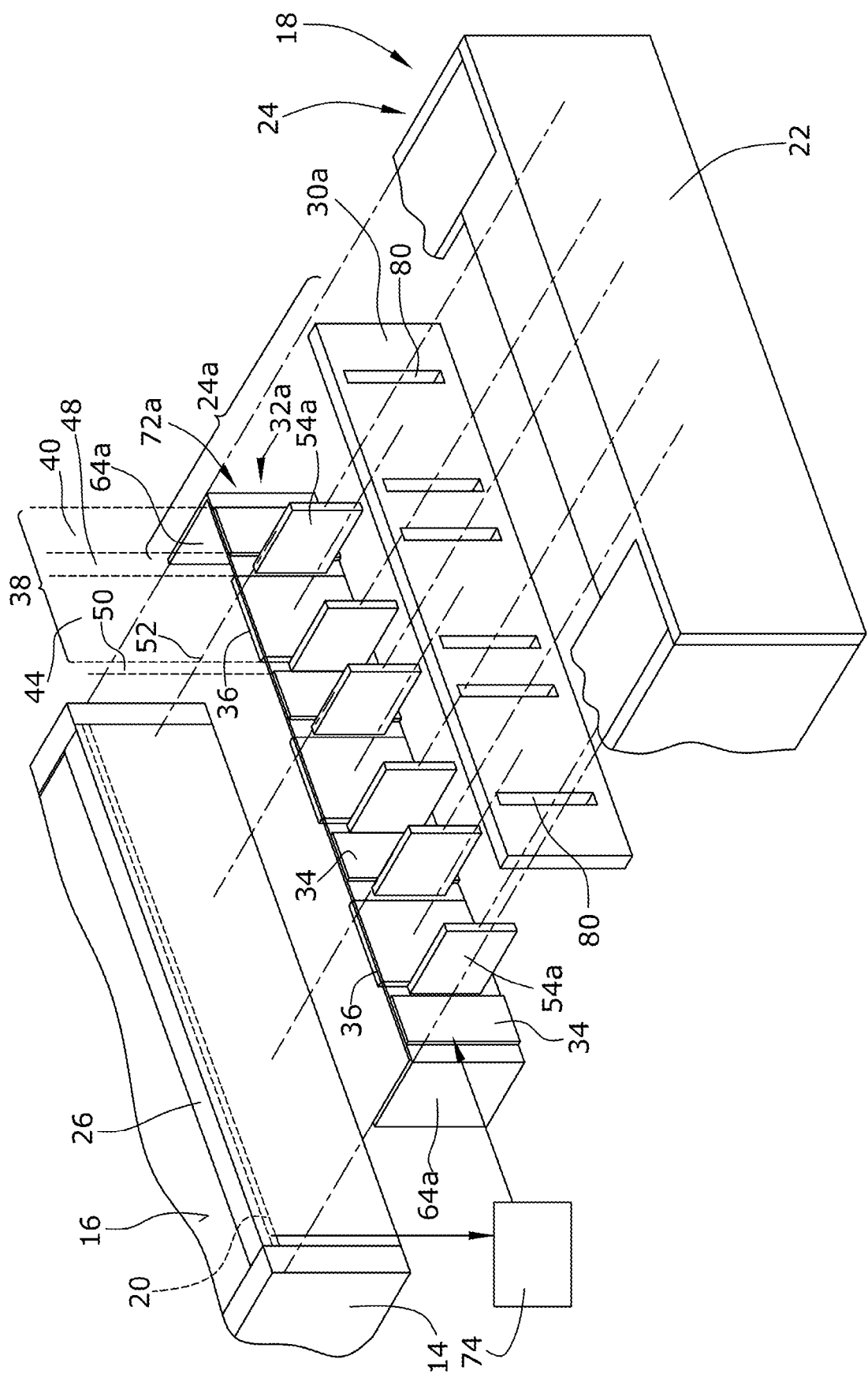
Figure 12:
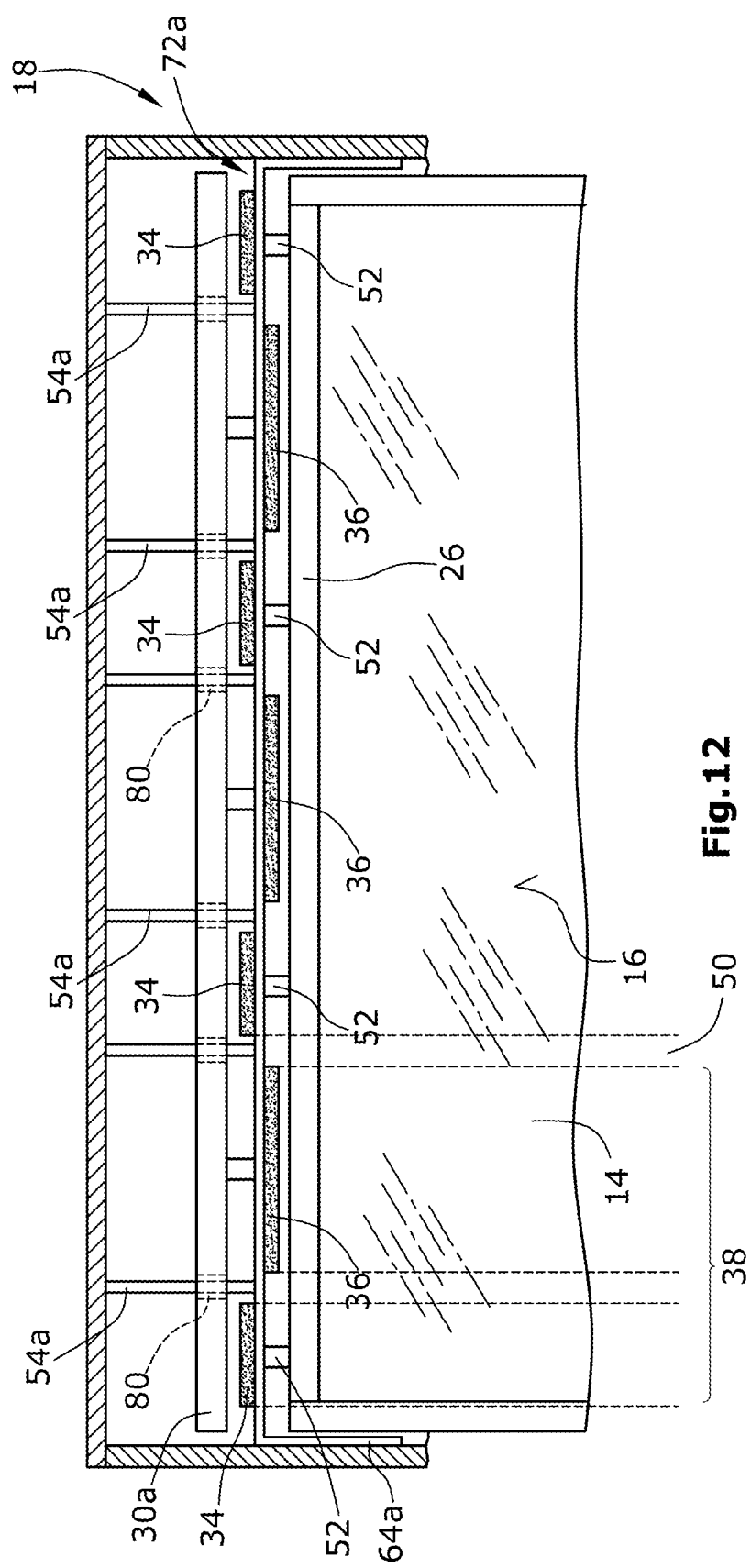
Figure 13:
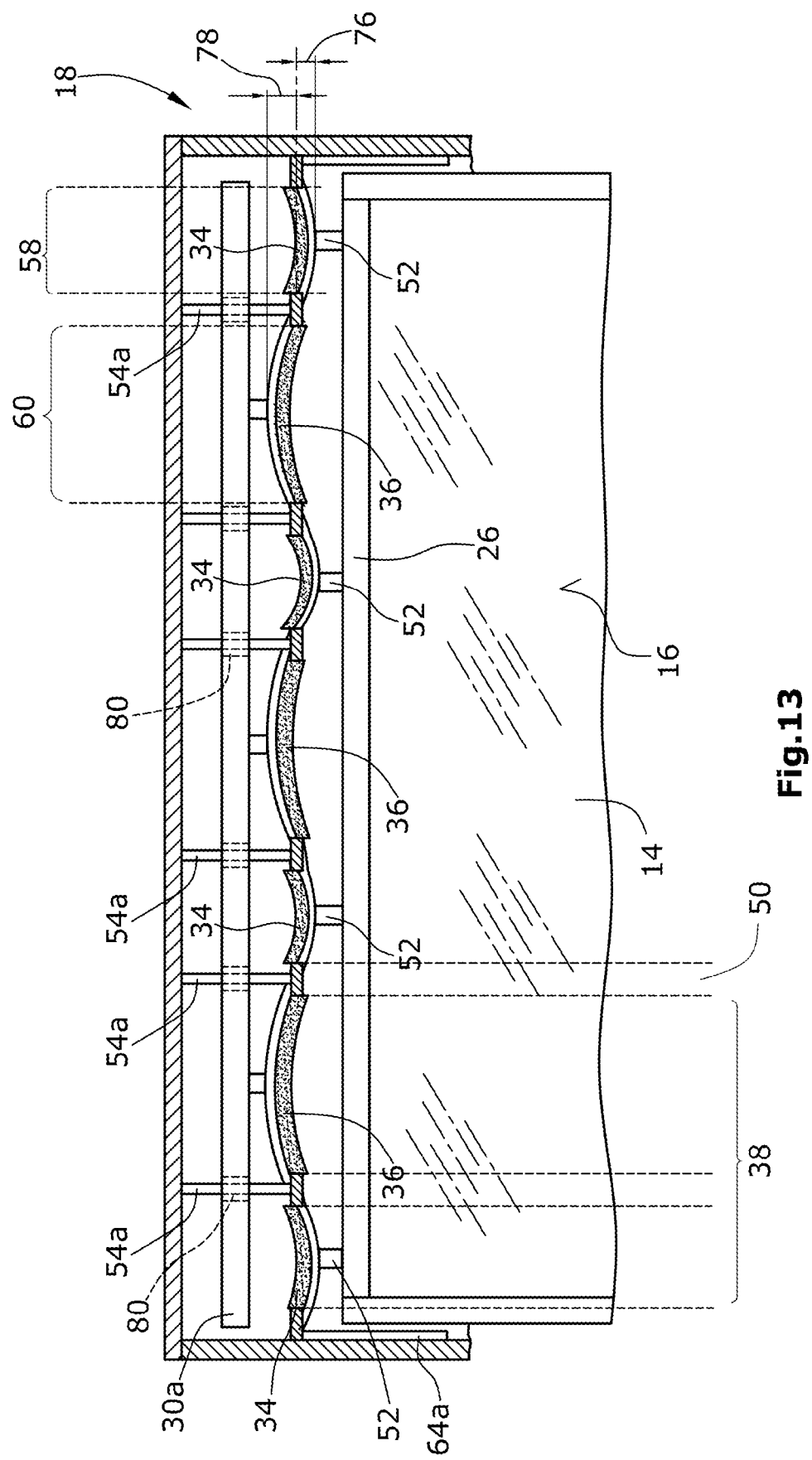
Figure 14:
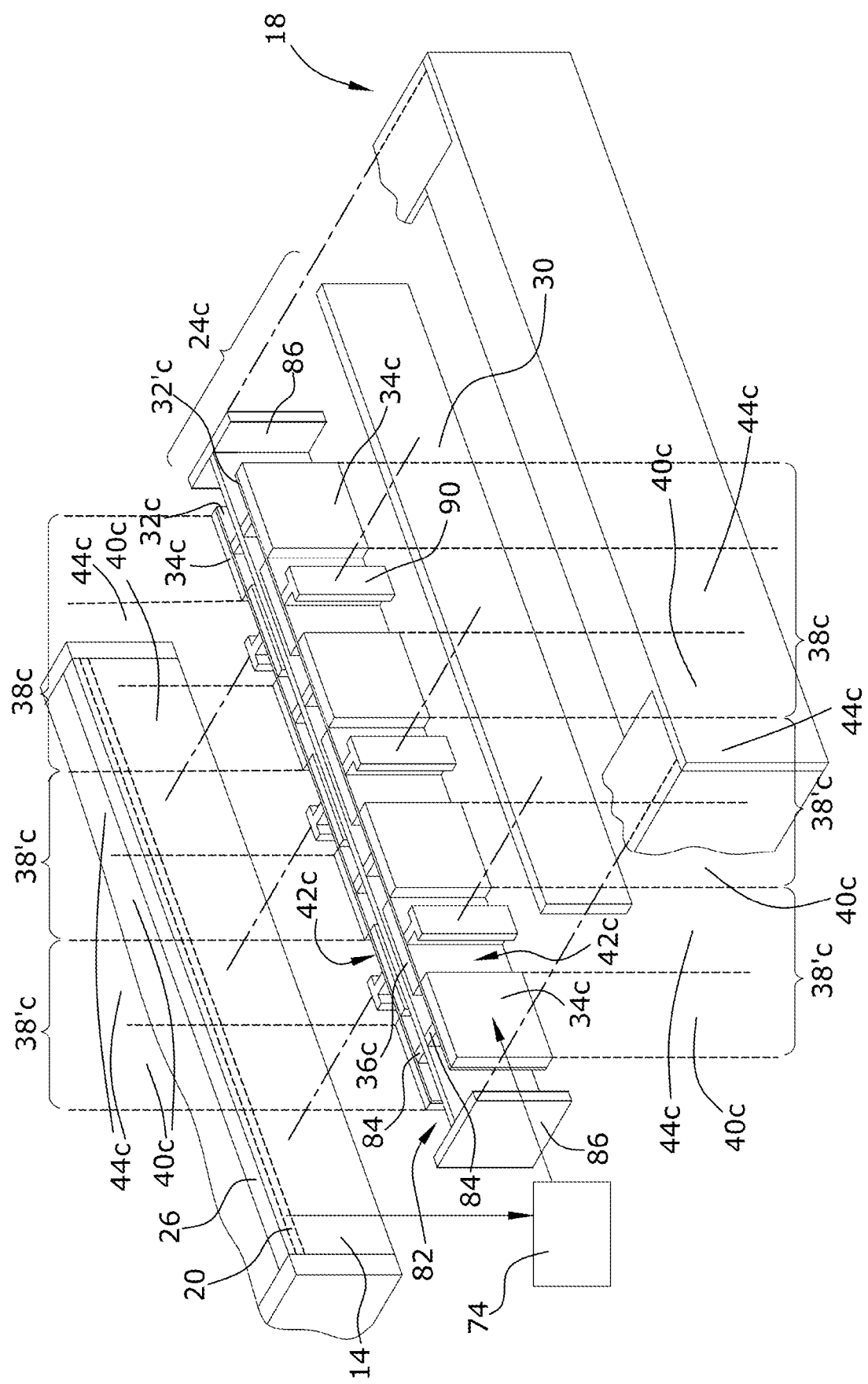
Figure 15:
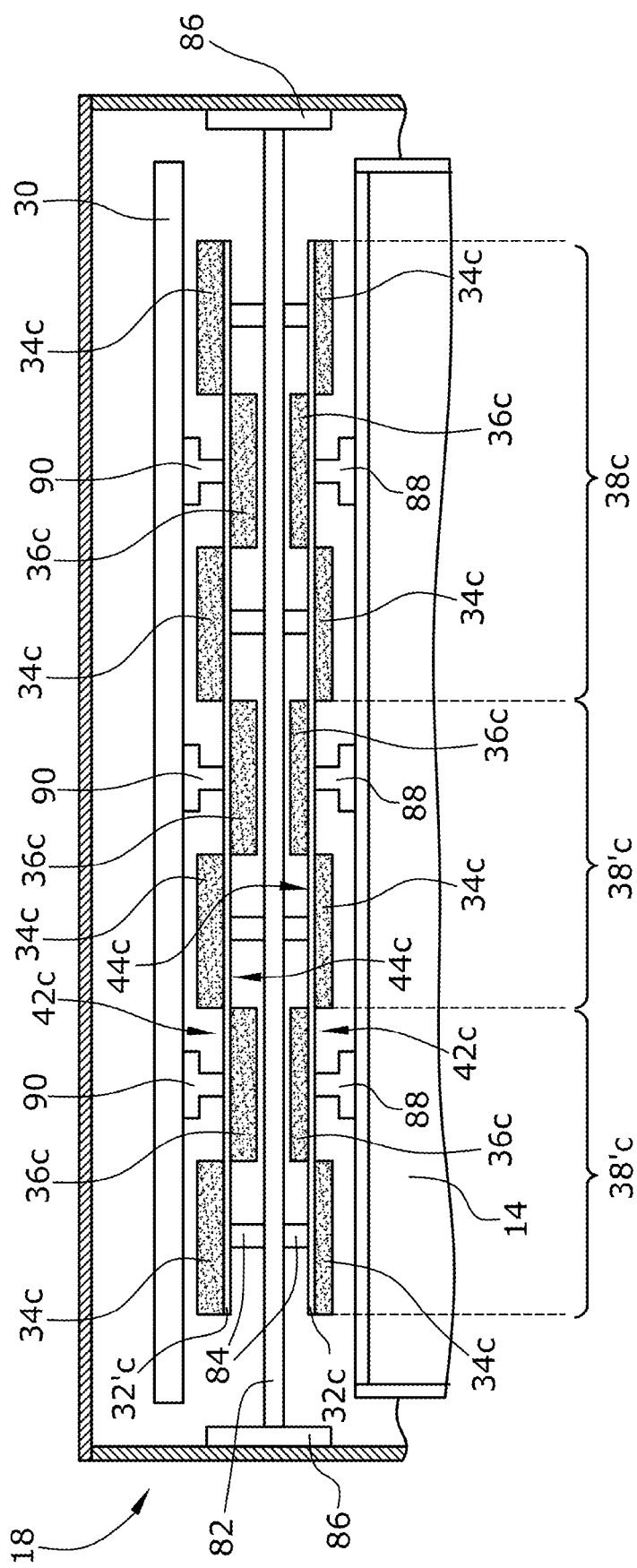
Figure 16:
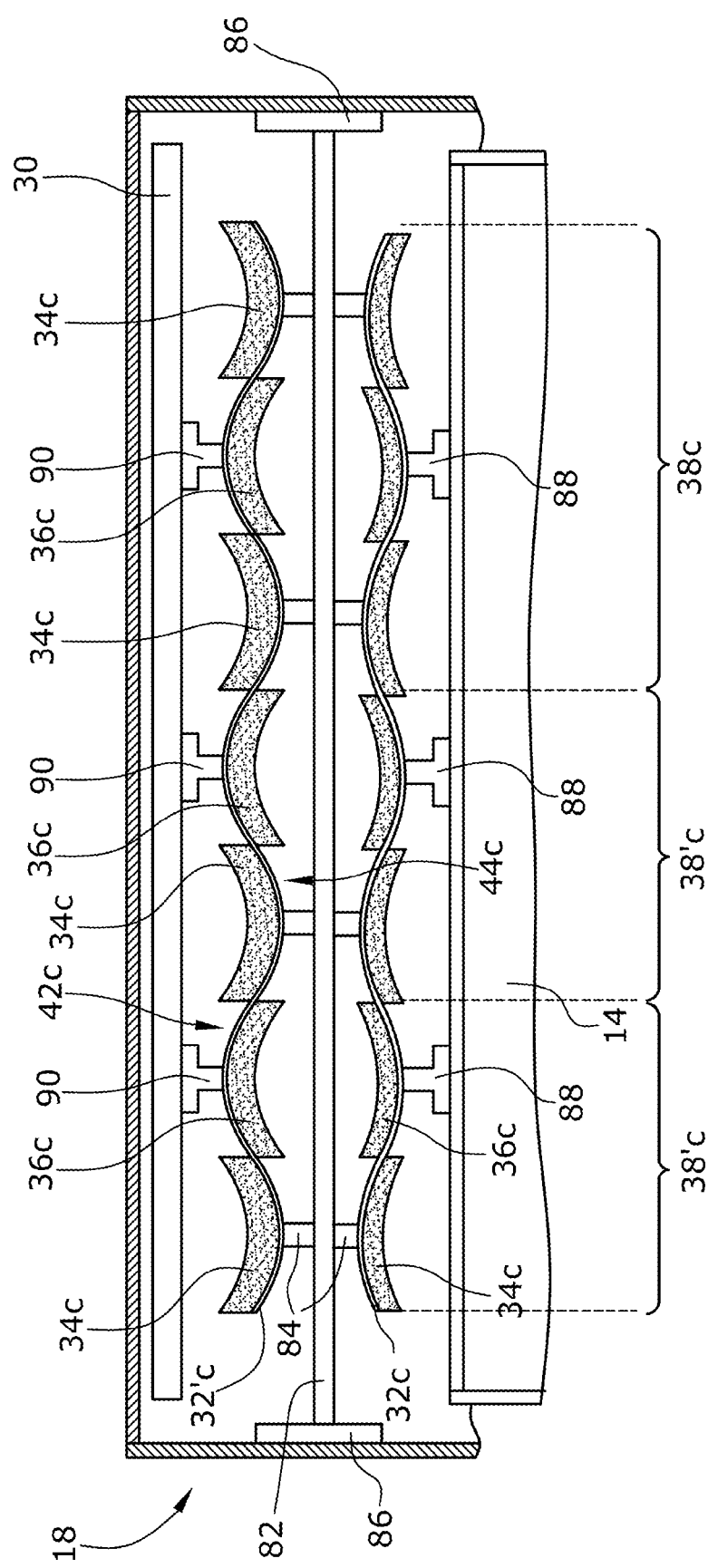
Figure 17:
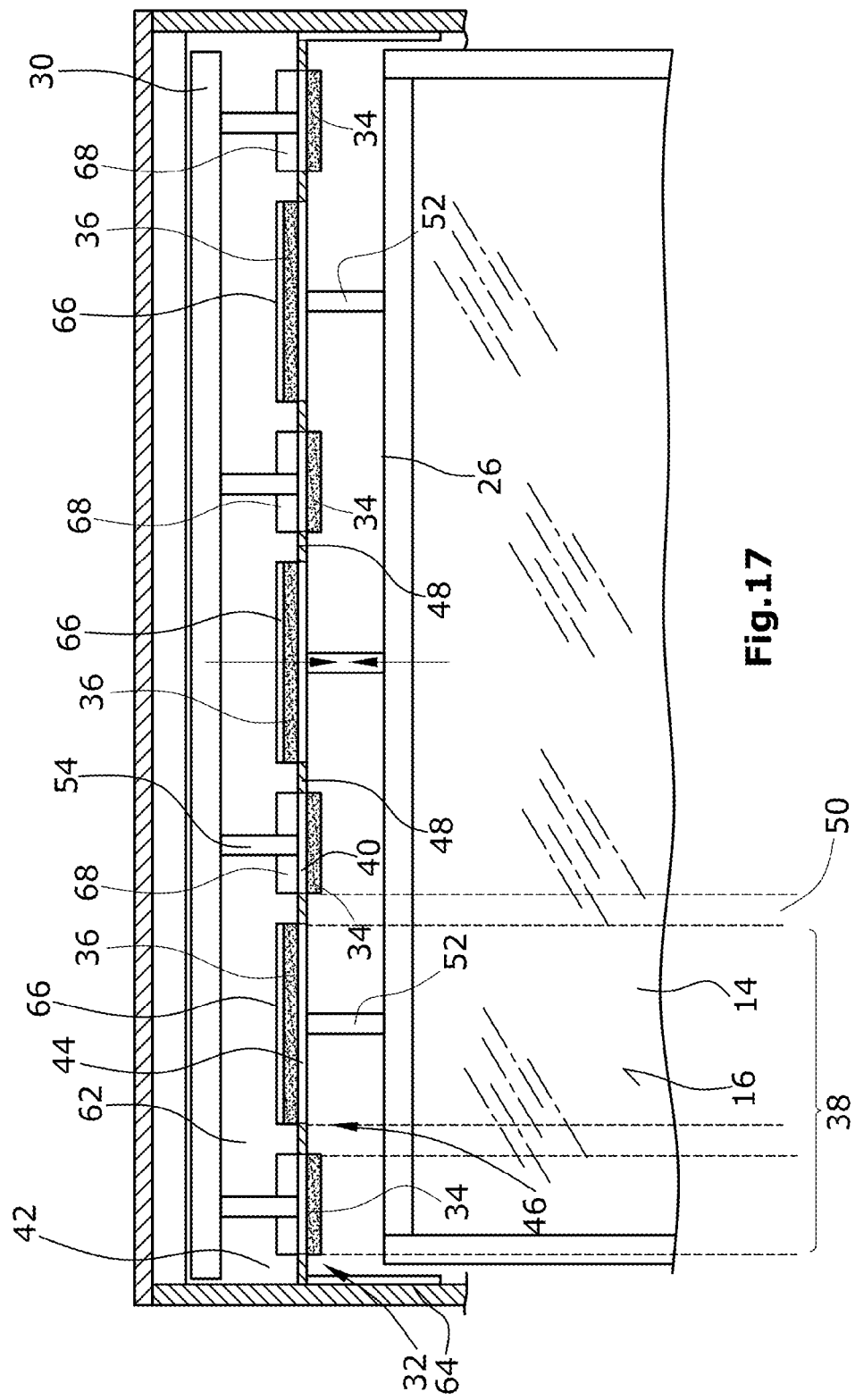

The invention will be explained in greater detail hereinafter on the basis of various exemplary embodiments and with reference to the drawing, in which, specifically:

FIG. 1 shows schematically the forces occurring in an operating unit with active haptic feedback, FIG. 2 shows a schematic illustration of the forces occurring with use in accordance with the invention of a counterweight as counterbalance, FIG. 3 in order to explain the balancing of moments shows schematically a construction of a counterforce-compensated haptic feedback in an operating unit, wherein the actuator is not specified in greater detail in respect of its construction, FIGS. 4 and 5 show further schematic sketches in order to explain the invention, FIG. 6 shows a plan view of an operating unit with housing and housing frame, wherein an actuator according to the invention is arranged along an edge portion of the housing frame between said frame and the operating element, FIG. 7 shows a section along the line VII-VII of FIG. 6 and FIG. 9, FIG. 8 shows a perspective exploded illustration of the structure of the actuator and arrangement thereof between operating element and housing frame, FIG. 9 shows a section along the line IX-IX of FIG. 7, wherein the actuator, as also in FIG. 8, is shown in its inactivated state, FIG. 10 shows a sectional view, similar to that according to FIG. 9, but in the activated state of the actuator, FIG. 11 shows a perspective exploded illustration similar to that according to FIG. 8, wherein an actuator according to a second exemplary embodiment is shown, FIG. 12 shows a sectional view similar to that according to FIG. 9, but in the inactivated state of the actuator, as shown in FIG. 11, FIG. 13 shows a sectional view similar to that according to FIG. 10, but with the actuator, as shown in FIG. 11, more specifically in the activated state, FIG. 14 shows a perspective exploded illustration similar to that according to FIGS. 8 and 11, but with an actuator according to a further exemplary embodiment of the invention, FIG. 15 shows a sectional view similar to that in FIGS. 9 and 12, more specifically with the actuator, as shown in FIG. 14, in the inactivated state, FIG. 16 shows a sectional view similar to that in FIGS. 10 and 13, wherein the actuator shown in FIG. 14 is in its activated state, FIGS. 17 and 18 show sectional views in which an actuator according to a further exemplary embodiment of the invention is shown, more specifically in the inactivated state (FIG. 17) and in the activated state (FIG. 18), and FIGS. 19 and 20 show sectional views through the edge region of the operating unit with use of an actuator according to a further exemplary embodiment, wherein this actuator is shown in the inactivated state (FIG. 19) and in the activated state (FIG. 20).

With regard to the illustration in the drawings of the actuators and the support strips of the actuators in the activated state thereof, it should firstly be mentioned that in the drawings the undulating form is shown heavily exaggerated in order to emphasise the principle according to the invention more clearly.

In accordance with the invention the use of an elastically mounted (see spring-mass damping system 22') movable counterbalance 20' between the actuator 16' and the housing 10' to balance the forces acting on the housing 10' is proposed (FIG. 2). The actuation of the operating element 12' is identified by means of the actuation sensor 19'. The signals are then received by the actuation sensor 19' via an evaluation and control unit 21', and control signals are sent to the actuator 16', and the actuator 16' is actuated.

With appropriate design of the additional spring-mass damping system 22' or $c_3$, $d_3$, $m_3$, the resultant force $F_2(t)$ acting on the vehicle can be eliminated (the static forces created by gravity do not play any role in the creation of noises and/or vibrations).

For an arbitrarily predefined display deflection $x_1(t)$, the deflection $x_2(t)$/movement of the device housing and thus also the force $F_2(t)$ on the device fastening can be eliminated under the following conditions:

$$c_3 = c_1 \frac{m_3}{m_1}, d_3 = d_1 \frac{m_3}{m_1}$$

This gives the following deflection of the counterbalance 20':

$$x_3(t) = x_1(t) \frac{m_1}{m_3}$$

Under these conditions the elasticity of the device fastening 18' also has no influence on the haptic feedback. The counterbalance 20' or $m_3$ is generally limited by the installation space specifications and is smaller than the display mass $m_1$. Ideally, it can be embodied as part of the actuator 16'.

The present invention makes it possible
- to generate a haptic feedback on weighty surfaces without any dynamic pulse effect on the surrounding environment.
- to generate a haptic feedback in an operating device that is independent of the elasticity of the device fastening.

FIG. 3, in order to explain the measures taken for pulse avoidance in operating units with active haptic feedback, shows a device having a counterforce-compensated haptic feedback.

In the shown example the actuator 16' is formed as an electromagnet with armature and has a stator laminated core elastically mounted on the housing 10' with actuator coil, i.e. a stator 26' and an armature laminated core, i.e. an armature 28', fixedly connected to the operating element 12'. The stator 26' forms the movable counterbalance 20' or comprises same. When adjusting the air gap shown at 30' in the electromagnet with armature, the maximum deflection of the operating element 12' and the counterbalance 20' relative to one another must be taken into consideration. The stator 26' is mounted elastically (spring-mass damping system 22') on the housing 10', but can also instead be elastically connected to the operating element 12'. The operating element guide is indicated at 32'. The housing 10' is fastened to the vehicle 24' (for example to the dashboard thereof).

As is clear from the above, in addition to the display unit that is actually to be moved or in addition to the operating field that is actually to be moved, a counterbalance mounted movably (and in a sprung manner) relative to the rigid housing of the operating unit is also moved for pulse avoidance in the haptic feedback. By way of a suitable selection of path, mass, damping and spring constant of this counterbalance, the pulse of the overall system can be prevented from being transferred to the vehicle body.

The lower is the weight of the operating element provided with active haptic feedback, the lesser the extent to which the counterbalance for pulse avoidance must be moved in an opposite direction as compared to the operating element. For example, the touch panel of a touchscreen or the cover plate (cover glass) thereof is a potential low-weight operating element, for which purpose these elements must be arranged movably relative to the display.

If the actuator responsible for the deflection is realised as a piezo actuator (specifically with mechanical transmission), it provides the possibility to integrate the additionally necessary components constituted by counterbalance, spring and damper into the actuator and thus spare additional components.

An advantage of the invention is the clever utilisation of mechanical properties, provided anyway, of piezoceramic materials, in particular in respect of outwardly pulse-free haptic feedback. Both costs and installation space can be saved as a result.

In order to attain noteworthy deflections and forces in the case of piezo actuators for haptic feedback, these actuators consist of a number of ceramic layers, which are separated from one another by electrodes. However, the deflections are generally too small to be used readily for the generation of haptic feedback.

Mechanical levers can be used, which are characterised by a transmission ratio. The force effect of the actuator may thus be increased at the expense of a smaller deflection thereof, or vice versa. These levers are often made of flexible materials (for example metal), which are mounted on the actual piezo ceramics.

Piezo ceramics are usually designed such that they generate an increasing return force with increasing deflection. From a mechanical viewpoint, besides their function as a transmission, they therefore also constitute springs, the spring stiffness c of which can be influenced by the construction. Their mass m can also be varied, for example by increasing the volume or by suitable selection of the material. The damping d is then given accordingly from the used materials and the selected geometry.

Compared with the sketch shown in FIG. 2, the components c3, d3 and m3 can therefore be interpreted as part of the actuator. The parameters for avoiding pulses must still satisfy the following equations:

$$c_3 = c_1 \frac{m_3}{m_1}, d_3 = d_1 \frac{m_3}{m_1}$$

It must now be noted that the paths x_3 and x_1, for which, when the above equation is satisfied, the following relationship $$x_3(t) = x_1 \frac{m_3}{m_1}$$

applies, and the force $F_{act}$ can no longer be determined directly from the force-path graph of the piezo. Instead, they must be determined from the variables directly at the piezo (indicated by P) under consideration of the mechanical transmission ratio n (see FIG. 5).

This gives $$x_3 = n \cdot x_{3P}, x_1 = n \cdot x_{1P}$$

$$F_{Act} = \frac{1}{n} F_p$$

Proceeding from FIG. 2, the mechanical components m3, c3 and d3 and n from FIG. 5 are realised by the lever from FIG. 4 (at least in part).

The mechanical transmission can be used additionally to redirect the direction of force. Due to the installation space, it may be necessary to position the (stacked) piezo ceramic such that its main direction of deflection does not coincide with the direction of the desired haptic feedback. Considered quite generally, this disadvantage can be remedied by suitable selection of the lever concept.

An operating unit will be explained hereinafter with reference to FIGS. 6 to 10 with a first exemplary embodiment of a piezo strip actuator according to the invention.

FIG. 6 shows a plan view, and FIG. 7 shows a partial sectional view of an operating unit 10 with a housing 12 and an operating element 14 with operating surface 16, around which the frame 18 of the housing runs. The operating unit 10 in this exemplary embodiment is a touchscreen, for example with capacitive touch panel as actuation sensor 20 (see for example also FIGS. 7 and 8), wherein it must be noted that the actuation sensor system could also be realised by a displacement sensor or force sensor, or a displacement sensor or force sensor of this kind can be provided in addition to the touch panel. It is thus possible that a valid actuation of the operating element 14 presupposes a slight pressing-down movement of the operating element 14. This is of subordinate importance for the invention, specifically the design of the actuator for the active haptic feedback.

As shown in FIG. 6, an actuator 24 is situated in the frame portion 22 and is arranged between the frame 18 and the edge portion 26 of the operating element 14 running parallel to said frame. Details of the actuator 24 are shown in FIGS. 7 to 10.

The actuator 24, according to FIG. 8, has a support body 28 fixed in the housing and a counterbalance 30, which in this exemplary embodiment is formed as a strip material body. The support body 28 for its part comprises a support strip 32 made of a flexible material, for example spring steel, on both sides of which and in the course of which along the longitudinal extent of the support strip 32, first and second piezo elements 34, 36 are arranged alternately. Conceptually, the support strip 32 can be divided in this exemplary embodiment into three successive dividing groups 38, which each comprise a first attachment portion 40, in which a first piezo element 34 is arranged on the first outer surface 42 of the support strip 32, and a second attachment portion 44, in which a second piezo element 36 is arranged on the second outer surface 46 of the support strip 32. A first intermediate portion 48 is situated between the two attachment portions 40 and 44. A second intermediate portion 50 of the support strip 32 is situated between adjacent dividing groups 38. In the region of the first attachment portions 40, the second outer surface 46 of the support strip 32 is mechanically connected to the operating element 14 (see the operating element connection elements 52 in FIG. 9, which are also indicated in FIG. 8), whereas the first outer surface 42 of the support strip 32 is mechanically coupled in the region of the second attachment portions 44 to the counterbalance 30 via counterbalance connection elements 54.

The support strip 32, as already mentioned above, is elastic, that is to say is capable of bending. This bending of the support strip 32 is brought about by actuation of the piezo elements 34, 36. These piezo elements 34, 36 change in respect of their length, i.e. their extent in the longitudinal direction of the support strip 32, in the event of actuation. The support strip 32 thus assumes the undulating form 56, as is shown in FIG. 10, when it is moved from its inactivated state shown in FIGS. 8 and 9 into the activated state. The undulating form 56 is created from first half waves 58 and second, oppositely directed half waves 60.

The support body 28 is fixed by first flanges 62 and second flanges 64. The first flanges 62 are arranged along the lateral edges of the support strip 32 and are angled, in particular right-angled, beyond the first outer surface 42. Recesses 66, 68 extend along the lateral edges in the first mounting flanges 62 or also (possibly additionally) in the support strip 32, more specifically within the regions of the first attachment portions 40 and the second attachment portions 44. Bridges 70 are then formed in the first and second intermediate portions 48, 50 between adjacent recesses 66, 68, via which bridges the first mounting flanges 62 are connected to the support strip 32. The second mounting flanges 64 are arranged at the ends 72 of the support strip 32 arranged oppositely in the longitudinal extent, which mounting flanges likewise are preferably angled at right angles, more specifically in this exemplary embodiment beyond the second outer surface 46. The support body 28 is fixed to the inner side of the frame 18 by the mounting flanges 62, 64. The recesses 66, 68 make possible the undulating deformation of the support strip 32, which is connected movably to the mounting flanges 62 by the bridges 70 in the intermediate portions 48, 50.

FIG. 8 additionally also shows a control unit 74, which receives a signal from the actuation sensor system 20, so as to then actuate the piezo elements 34, 36. The operating element 14 and counterbalance 30 are moved synchronously in opposite directions if the support strip 32 is transferred from its inactivated position (see FIG. 9) into its activated position (see FIG. 10).

FIG. 10 shows that the amplitude 76 of the first half wave 58 is smaller than the amplitude 78 of the second half wave 60 of the undulating form 56 of the support strip 32 in the activated state thereof. The stroke movement experienced by the operating element 14 is thus smaller than the stroke movement of the counterbalance 30. For the pulse compensation, is true that the kinetic energy expended for the operating element 14 should be equal to the kinetic energy applied for the counterbalance 30. Both move in opposite directions, which means that with greater counterbalance stroke movement 78, the counterbalance 30 has an accordingly lower weight and the operating element 14.

It can be seen in FIGS. 9 and 10 that the movement concept for operating element 14 and counterbalance 30 is based on the "principle of repulsion". The operating element 14 and counterbalance 30 move away from one another for pulse compensation if the support strip 32 is transferred into its activated state, and if the support strip 32 is transferred back into its inactivated state from its activated state. In both cases the forces acting outwardly on account of the movement of the operating element 14 are compensated (pulse avoidance).

FIGS. 17 and 18 show the movement principle of the actuator 24b in reverse. To this end, the alternating arrangement of the piezo elements 34, 36 and the mechanical coupling of operating element 14 and counterbalance 30 to the support strip 32 are swapped, which affects the arrangement of the aforementioned elements on the outer surfaces of the support strip 32. Thus, the operating element 14 and counterbalance 30 now move towards one another if the support strip 32 is transferred into its activated state, and accordingly move away from one another if the support strip is transferred from the activated state back into the inactivated state.

FIGS. 11 to 13 show an actuator 24a in accordance with a second exemplary embodiment. Insofar as the elements of the actuator 24a equate those of the actuator 24 in FIGS. 8 and 10 in terms of construction and/or function, they are denoted in FIGS. 11 to 13 with the same reference signs as in FIGS. 8 to 10 or are denoted by the same reference signs supplemented by the letter a.

The actuator 24a comprises the support strip 32a, which is fixed to the frame portion 22 via the mounting flanges 64a at its ends 72a arranged in lateral extents. The division of the support strip 32a into the individual dividing groups 38 or the individual attachment portions 40, 44 and the intermediate portions 48, 50 is selected as shown in FIG. 8.

In contrast to the actuator 24 of FIGS. 8 to 10, the actuator 24a is supported on the frame portion 22 via connection elements 54a, which in particular are planar. These connection elements 62a are arranged in the intermediate portions 48, 50 and protrude from the support strip 32a, laterally from the first outer surface 42 thereof. They extend through recesses 80 in the counterbalance 30a. The connection of the counterbalance 30a and of the operating element 14 in each case to the support strip 32a is thus realised as described further above in conjunction with FIGS. 8 to 10.

The situation in the inactivated state and also in the activated state of the support strip 32a of the actuator 24a is shown in the sectional views of FIGS. 12 and 13.

FIGS. 14 to 16 show a further exemplary embodiment of an actuator 24c, which again is formed in a strip-like manner. Those elements of the actuator 24c and of the operating units that equate or correspond in respect of their function and/or construction to the elements of the operating units and actuators of FIGS. 8 to 13 are denoted in FIGS. 14 to 16 with the same reference signs or with the same reference signs, supplemented by the letter c.

The actuator 24c is designed as a double-strip actuator and comprises a first support strip 32c and a second support strip 32'c. Both support strips 32c, 32'c are provided alternately with first and second piezo elements 34c and 36c. These piezo elements are situated alternately on the first and second outer surfaces 42c, 46c of the relevant support strip 32c, 32'c. Both support strips are in each case divided into a first dividing group 38c and into two further second dividing groups 38'c. The first dividing group 38c has two first attachment portions 40c and a second attachment portion 44c, which is positioned between the two first attachment portions 40c of the first dividing group 38c. Each further second dividing group 38'c comprises a second attachment portion 44c and a first attachment portion 40c.

A connection element 82 runs between the two support strips 32c and 32'c and is likewise formed as a strip and comprises connection bridges 84 to the support strips 32c and 32'c. The connection bridges 84 connect the two support strips 32c, 32'c to one another, more specifically at the first outer surface 42c of the support strips in the first attachment portions 40c thereof. The connection element 82 is connected at its ends arranged oppositely in the longitudinal extent to the frame 18 of the housing 12. This is indicated in FIGS. 14 to 16 by the connection element 86.

The first support strip 32c is mechanically connected at its second outer surface 46c to the operating element 14 within each second attachment portion 44c in each case by means of a connection element 88, whereas the second support strip 32'c is connected to the counterbalance 30 by means of connection elements 90 that are arranged on the second outer surface 46c of said support strip in each second attachment portion 44c.

In FIGS. 14 and 15 the actuator 24c is shown in its inactivated state, in which the support strip 32c, 32'c has a linear course in this exemplary embodiment. In the event that the piezo elements 34c, 36c are actuated by the control unit 74, the support strips 32c, 32'c deform in an undulating manner, as is shown in FIG. 16. Based on the connection element, the operating element 14 and the counterbalance 30 are thus repelled in opposite directions, that is to say move away from one another, wherein, by way of appropriate choice of thickness and size of the piezo elements 34c, 36c of the support strip 32'c, the stroke movement 78 of said support strip should be selected to be greater than the stroke movement 76 that is performed by the first support strip 32c. Accordingly, the weight of the counterbalance 30 can be selected to be smaller in comparison to the weight of the operating element 14, wherein there is still a pulse compensation.

For the sake of completeness it should be mentioned at this juncture that the concept of the repulsion of operating element 14 and counterbalance 30 of the actuator 24c in FIGS. 14 to 16 can also be selected inversely. The two elements constituted by the counterbalance 30 and operating element 14 could thus be moved towards one another by an inverse arrangement of the piezo elements (based on the outer surfaces of the two support strips 32c, 32'c), if the actuator 24c is activated. There would then also be a pulse compensation.

A further exemplary embodiment of an actuator 24d according to the invention will now be described on the basis of FIGS. 19 and 20, which actuator is a modification of the actuator 24 in FIGS. 8 to 10. Those elements of the actuator 24d that are similar to, or the same as those of the actuator 24 in respect of their function and/or construction are provided in FIGS. 19 and 20 with the same reference signs as in FIGS. 8 to 10.

The difference of the actuator 24d from the actuator 24 is seen in that two first and second piezo elements 34 and 36 respectively are arranged within the individual attachment portions 40, 44, wherein, between these pairs of piezo elements, the connection elements 52 for mechanical connection to the operating element 14 and the connection elements 54 for connection of the support strip 32 to the counterbalance 30 are arranged. The piezo elements 34, 36 (and the connection elements 52, 54) are arranged in each case on the outer sides of the half-wave arcs of the support strip 32.

The invention has been described above by exemplary embodiments in which piezo elements are arranged alternately on both outer sides of the support strip and, when electrically actuated, all (also) expand out or collapse in in the longitudinal extent of the support strip. The piezo elements, however, can also be arranged on both outer sides of the support strip. In order to attain the undulating form, the piezo elements must be arranged on one outer side in such a way that each second piezo element expands out and the piezo elements arranged therebetween collapse in, wherein the opposite piezo elements on the other outer side of the support strip behave inversely when they are actuated. It is also possible to arrange the piezo elements on merely one common outer side of the support strip. Here as well the actuation of the piezo elements should be realised in such a way that each second piezo element expands out and the piezo elements arranged in-between collapse in. Furthermore, the support strip can also consist of a plurality of separate partial support strip elements, wherein each partial support strip element comprises at least one piezo element on at least one outer side. The previously described variants and the variants of the invention according to the exemplary embodiments described in detail can also be extended in such a way that, instead of the individual piezo elements, groups of piezo elements to be actuated identically are then provided. A plurality of groups of piezo elements would thus then be arranged alternately on different sides or on one side or also on both sides.

LIST OF REFERENCE SIGNS

10' housing
12' operating element
14' spring-damping system of the elastic attachment of the operating element to the housing
16' actuator
18 spring-damping system of the (elastic) attachment of the housing to the vehicle
19' actuation sensor
20' counterbalance
21' evaluation and control unit
22' spring-damping system of the elastic attachment of the counterbalance to the housing and/or to the operating element
24' vehicle or dashboard of the vehicle
26' stator of the electromagnet with armature embodied as actuator
28' armature of the electromagnet with armature
30' air gap of the electromagnet with armature
32' operating field guidance for the movement in the event of haptic feedback
$m_1$ mass of the operating field
$x_1(t)$ deflection of the operating field
$F_{Act}(t)$ actuator force progression
$F_1(t)$ force of the operating field acting on the housing 10' in the event of excitation thereof ($F_1(t)=F_{Act}-m_1 \times a_1$)
$c_1$ spring constant of the elastic attachment of the operating field to the housing
$d_1$ damping of the elastic attachment of the operating field to the housing
$m_2$ mass of the housing
$x_2(t)$ deflection of the housing as a result of the force exerted by the mechanically excited operating field
$F_2(t)$ force acting on the housing fastening
$m_3$ mass of the counterbalance
$x_3(t)$ deflection of the counterbalance
$F_3$ force acting on the housing by the counterbalance
$c_3$ spring constant of the elastic attachment of the counterbalance to the housing
$d_3$ damping of the elastic attachment of the counterbalance to the housing
10 operating unit
12 housing
14 operating element
16 operating surface
18 frame of the housing
20 actuation sensor 22 frame portion
24 actuator
24a actuator
24b actuator
24c actuator
24d actuator
26 edge portion
28 support body
30 counterbalance
30a counterbalance
32 support strip
32a support strip
32c first support strip
32'c second support strip
34 first piezo element
34c first piezo element
36 second piezo element
36c second piezo element
38 dividing groups
38c first dividing group
38'c further dividing group
40 first attachment portion
40c first attachment portion
42 first outer surface
42c first outer surface
44 second attachment portion
44c second attachment portion
46 second outer surface
46c second outer surface
48 first intermediate portion
50 second intermediate portion
52 operating element connection element
54 counterbalance connection element
54a planar connection element
56 undulating form
58 first half wave
60 second half wave
62 first mounting flange
62a connection element
64 second mounting flange
64a second mounting flange
66 recess
68 recess
70 bridge
72 opposite ends of the support strip
72a end of the support strip
74 control unit
76 amplitude
78 amplitude
80 recess
82 connection element
84 connection bridge
86 connection element
88 connection element
90 connection element

The invention claimed is:

1. An operating unit for a device, for example for a vehicle component, in particular human-machine interface (MMI or HMI), with a housing, which has an operating element with an operating field, such as a touchscreen or a touchpad or a display or a cover plate of a touchscreen or a display and is intended to be fastened in and/or to a device, in particular to a vehicle dashboard or vehicle centre console, wherein the operating element is mounted elastically in the housing, a sensor for identifying operation of the operating element, an actuator for mechanically exciting the operating element in the event that operation of the operating element has been identified, and a counterbalance, which is mounted movably in/on the housing, wherein the counterbalance is mechanically excitable by the, or an actuator in the event that operation of the operating element has been identified, wherein the counterbalance is movable for substantial compensation and/or prevention and/or damping of forces that act on the housing as a result of the movement of the operating element occurring when the actuator is activated, wherein the actuator is provided with a support strip comprising a resilient material, in particular spring steel, and having a first outer surface and a second outer surface, wherein the support strip has at least one dividing group formed of a first attachment portion, a second attachment portion and a first intermediate portion arranged between the two attachment portions, wherein the first attachment portion, the first intermediate portion and the second attachment portion are arranged in succession in the longitudinal extent of the support strip, wherein, with a plurality of adjacent dividing groups in its longitudinal extent, the support strip has a second intermediate portion between the second attachment portion of one dividing group and the first attachment portion of the adjacent dividing group, first and second electrically controllable piezo elements connected in a shear-resistant manner to the support strip, each of which piezo elements—considered in the longitudinal extent of the support strip—has a length that without electrical actuation of the piezo element assumes a first length value and with electrical actuation assumes a second length value, which is different from the first length value, wherein at least one first piezo element is arranged in a first attachment portion of the support strip on the first outer surface thereof and at least one second piezo element is arranged in a second attachment portion of the support strip on the second outer surface thereof, wherein the first intermediate portions and, if provided, the second intermediate portions of the support strip are mechanically coupled to the housing for the purpose of fixing the support strip, and wherein the support strip is mechanically coupled to the operating element in a first attachment portion and is mechanically coupled to the counterbalance in a second attachment portion, and a control unit, by means of which the piezo elements can be actuated in order to transfer the support strip from its inactivated state, in which the operating element and the counterbalance, which are arranged on either side of the support strip, have a first distance from one another, with displacement of operating element and counterbalance in opposite directions, into an undulating activated state and in order to transfer the support strip from the activated stated back into the inactivated state.

2. The operating unit according to claim 1, characterised in that the support strip, in its inactivated state, runs along a reference line, and in that the undulating form of the support strip, in the activated state of said support strip, has first half waves on one side of the reference line and second half waves on the opposite side of the reference line, wherein each first attachment portion of the support strip has a first half wave with first piezo element facing—or alternatively facing away from—the reference line and second outer surface facing away from—or alternatively facing—the reference line, and each second attachment portion of the support strip forms a second half wave with second piezo element facing—or alternatively facing away from—the reference line and first second outer surface facing—or alternatively facing away from—the reference line.

3. The operating unit according to claim 1, characterised in that the support strip is provided at each of its opposite ends in the longitudinal extent with a second intermediate portion, next to which there is arranged a first attachment portion, which is in turn distanced from an adjacent second attachment portion by a first or second intermediate portion.

4. The operating unit according to claim 1, characterised in that the support strip is provided at each of its lateral edges with a first mounting flange for fastening to the housing, in that the mounting flanges are connected by bridges to the first and, if provided, second intermediate portions, and in that recesses arranged between the bridges and adjacent to the lateral edges of the support strip are formed in the support strip and/or in the mounting flanges.

5. The operating unit according to claim 4, characterised in that the first mounting flanges, in relation to the support strip, run at an angle to the side thereof, in particular at right angles to the side thereof.

6. The operating unit according to claim 1, characterised in that the support strip is provided at each of its opposite ends in longitudinal extent with a second mounting flange for fastening to the housing.

7. The operating unit according to claim 6, characterised in that the second mounting flanges, in relation to the support strip, run at an angle to the side thereof, in particular at right angles to the side thereof.

8. The operating unit according to claim 1, characterised in that connection elements for fixing the support strip, in/on the housing protrude from the support strip within the first and, if provided, second intermediate portions.

9. The operating unit according to claim 8, characterised in that the counterbalance is formed as a material strip body, which has recesses, through which the connection elements extend with play.

10. The operating unit according to claim 1, characterised in that, in the activated state of the support strip, the ratio of the amplitude of the first half wave to the amplitude of the second half wave is inverse to the ratio of the weight of the operating element to the weight of the counterbalance.

11. The operating unit according to claim 1, characterised in that the counterbalance is formed as a material strip.

12. The operating unit according to claim 1, characterised in that the actuator is arranged along a first edge portion of the operating element.

13. The operating element for a device, for example for a vehicle component, in particular human-machine interface (MMI or HMI) with
- a housing, which has an operating element with an operating field, such as a touchscreen or a touchpad or a display or a cover plate of a touchscreen or a display and is intended to be fastened in and/or to a device, in particular to a vehicle dashboard or vehicle centre console,
- wherein the operating element is mounted elastically in the housing,
- a sensor for identifying operation of the operating element,
- an actuator for mechanically exciting the operating element in the event that operation of the operating element has been identified, and
- a counterbalance, which is mounted movably in/on the housing,
- wherein the counterbalance is mechanically excitable by the, or an actuator in the event that operation of the operating element has been identified,
- wherein the counterbalance is movable for substantial compensation and/or prevention and/or damping of forces that act on the housing as a result of the movement of the operating element occurring when the actuator is activated,
- wherein the actuator is provided with
- a first support strip comprising a resilient material, in particular spring steel, and having a first outer surface and a second outer surface,
- wherein the first support strip has at least one dividing group with two first attachment portions and a second attachment portion arranged in each case therebetween, wherein the attachment portions are arranged in succession in the longitudinal extent of the first support strip,
- a second support strip, running parallel to the first support strip, comprising a resilient material, in particular spring steel, and having a first outer surface facing the first outer surface of the first support strip and a second outer surface facing away from the first outer surface of the first support strip,
- wherein the second support strip comprises at least one dividing group with two first attachment portions and a second attachment portion arranged therebetween, wherein the attachment portions are arranged in succession in the longitudinal extent of the second support strip,
- a connection element, by means of which the two support strips are connected to one another and which is connected to the housing in order to fix the two support strips, wherein the connection element connects first attachment portions of the first support strip on the first outer surface thereof to first attachment portions of the second support strip on the first outer surface thereof,
- first and second electrically actuatable piezo elements connected in a shear-resistant manner to the two support strips, each of which piezo elements—considered in the longitudinal extent of the support strip—has a length that without electrical actuation of the piezo element assumes a first length value and with electrical actuation assumes a second length value different from the first length value,
- wherein at least one first piezo element is arranged in each first attachment portion of the first support strip on the second outer surface thereof and at least one second piezo element (36c) is arranged in each second attachment portion of the first support strip on the first outer surface thereof, and wherein at least one first piezo element is arranged in each first attachment portion of the second support strip on the second outer surface thereof, and at least one second piezo element (36c) is arranged in each second attachment portion of the second support strip on the first outer surface thereof, and
- wherein the first support strip is coupled mechanically in each second attachment portion to the operating element, and the second support strip is coupled mechanically in each second attachment portion to the counterbalance, a control unit, by means of which the piezo elements can be actuated in order to transfer both support strips from their inactivated states, in which the operating element and the counterbalance, which are arranged on either side of the arrangement formed of the two support strips and the connection element, have a first distance from one another, with displacement of operating element and counterbalance in opposite directions, into an undulating activated state, in which the operating element and counterbalance have a second distance from one another, different from the first distance, and in order to transfer the support strips from their activated states back into their inactivated states.

14. The operating unit according to claim 13, characterised in that the two support strips in their inactivated states each run along a reference line, and in that the undulating forms of the two support strips in their activated states have first half waves on one side of the relevant reference line and second half waves on the opposite side of the relevant reference line, wherein each first attachment portion of the first support strip forms a first half wave with first piezo element facing—or alternatively facing away from—the reference line of the first support strip and first outer surface facing away from—or alternatively facing—the reference line of the first support strip, and each second attachment portion of the first support strip forms a second half wave with second piezo element ($36c$) facing—or alternatively facing away from—the reference line of the first support strip and first outer surface facing away from—or alternatively facing—the reference line of the first support strip, and wherein each first attachment portion of the second support strip forms a first half wave with first piezo element facing—or alternatively facing away from—the reference line of the second support strip and first outer surface facing away from—or alternatively facing —the reference line of the second support strip, and each second attachment portion of the second support strip forms a second half wave with second piezo element ($36c$) facing—or alternatively facing away from—the reference line of the second support strip and second outer surface facing away from—or alternatively facing—the reference line of the second support strip.

15. The operating unit according to claim 13, characterised in that the connection element is arranged in the gap between the two support strips and is connected to the housing outside the region occupied by the support strips.

16. The operating unit according to claim 13, characterised in that, in the activated state of both support strips, the ratio of the sum of the amplitudes of the first and second half waves of the first support strip to the sum of the amplitudes of the first and second half waves of the second support strip is inverse to the ratio of the weight of the operating element to the weight of the counterbalance.

17. The operating unit according to claim 13, characterised in that the actuator is arranged along a first edge portion of the operating element.

18. The operating unit according to claim 13, characterised in that each support strip has at least one further dividing group, which comprises a first attachment portion and a second attachment portion, which is arranged next to a first attachment portion of an adjacent dividing group, in that the connection element connects the two support strips in the first attachment portion of each further dividing group, in that the operating element is mechanically coupled to the first support strip at the second outer surface thereof in the second attachment portion of each further dividing group and the counterbalance is mechanically coupled to the second support strip on the second outer surface thereof in the first attachment portion of each further dividing group ($38'c$), and in that a first piezo element is connected in a shear-resistant manner to the relevant support strip at the second outer surface of each support strip in the first attachment portion of each further dividing group ($38'c$), and a second piezo element ($36c$) is connected in a shear-resistant manner to the relevant support strip on the first outer surface of each support strip in the second attachment portion of each further dividing group ($38'c$).

19. The operating unit according claim 1, characterised in that the actuator is formed as a piezo actuator and has an electrically excitable piezo ceramic element and a mechanical gearing mechanism for converting a linear elongation (with subsequent reduction in length) of the piezo ceramic element into a movement of the operating element, wherein the mechanical gearing mechanism has at least one gearing mechanism element forming the counterbalance and/or part of the counterbalance and/or the elastic mounting of the operating element and at least one further gearing mechanism element forming the elastic mounting of the operating element.

20. The operating unit according to claim 13, characterised in that the actuator is formed as a piezo actuator and has an electrically excitable piezo ceramic element and a mechanical gearing mechanism for converting a linear elongation (with subsequent reduction in length) of the piezo ceramic element into a movement of the operating element, wherein the mechanical gearing mechanism has at least one gearing mechanism element forming the counterbalance and/or part of the counterbalance and/or the elastic mounting of the operating element and at least one further gearing mechanism element forming the elastic mounting of the operating element.

* * * * *